(12) United States Patent
Danilov et al.

(10) Patent No.: US 11,119,690 B2
(45) Date of Patent: Sep. 14, 2021

(54) CONSOLIDATION OF PROTECTION SETS IN A GEOGRAPHICALLY DIVERSE DATA STORAGE ENVIRONMENT

(71) Applicant: EMC IP Holding Company LLC, Hopkinton, MA (US)

(72) Inventors: Mikhail Danilov, Saint Petersburg (RU); Yohannes Altaye, Dumfries, VA (US)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 26 days.

(21) Appl. No.: 16/670,746

(22) Filed: Oct. 31, 2019

(65) Prior Publication Data

US 2021/0132851 A1 May 6, 2021

(51) Int. Cl.
*G06F 3/06* (2006.01)
*H03M 13/29* (2006.01)

(52) U.S. Cl.
CPC ............ *G06F 3/0652* (2013.01); *G06F 3/067* (2013.01); *G06F 3/0608* (2013.01); *G06F 3/0622* (2013.01); *H03M 13/293* (2013.01)

(58) Field of Classification Search
CPC ...... G06F 3/067; G06F 3/0652; G06F 3/0608; G06F 3/0622; H03M 13/293
USPC .......................................................... 711/154
See application file for complete search history.

(56) References Cited

U.S. PATENT DOCUMENTS

| | | |
|---|---|---|
| 5,675,802 A | 10/1997 | Allen et al. |
| 5,805,788 A | 9/1998 | Johnson |
| 5,950,225 A | 9/1999 | Kleiman |
| 6,502,243 B1 | 12/2002 | Thomas |
| 7,389,393 B1 | 6/2008 | Karr et al. |
| 7,577,091 B2 | 8/2009 | Antal et al. |
| 7,631,051 B1 | 12/2009 | Fein et al. |
| 7,664,839 B1 | 2/2010 | Karr et al. |
| 7,680,875 B1 | 3/2010 | Shopiro et al. |
| 7,721,044 B1 | 5/2010 | Chatterjee et al. |

(Continued)

OTHER PUBLICATIONS

Non-Final Office Action received for U.S. Appl. No. 16/526,142 dated Oct. 15, 2020, 21 pages.

(Continued)

*Primary Examiner* — Hashem Farrokh
(74) *Attorney, Agent, or Firm* — Amin, Turocy & Watson, LLP

(57) ABSTRACT

Erasure coding for scaling-out of a geographically diverse data storage system is disclosed. Chunks can be stored according to a first erasure coding scheme in zones of a geographically diverse data storage system. In response to scaling-out the geographically diverse data storage system, chunks can be moved to store data in a more diverse manner. The more diverse chunk storage can facilitate changing storage from the first erasure coding scheme to a second erasure coding scheme. The second erasure coding scheme can have a lower storage overhead than the first erasure coding scheme. In an aspect, the erasure coding scheme change can occur by combining erasure coding code chunks having complementary coding matrixes. Combining erasure coding code chunks having complementary coding matrixes can consume fewer computing resources than re-encoding data chunks for the second erasure coding scheme in a conventional manner.

20 Claims, 10 Drawing Sheets

(56) References Cited

U.S. PATENT DOCUMENTS

| | | |
|---|---|---|
| 8,125,406 B1 | 2/2012 | Jensen et al. |
| 8,261,033 B1 | 9/2012 | Slik et al. |
| 8,370,542 B2 | 2/2013 | Lu et al. |
| 8,479,037 B1 | 7/2013 | Chatterjee et al. |
| 8,495,465 B1 | 7/2013 | Anholt et al. |
| 8,540,625 B2 | 9/2013 | Miyoshi |
| 8,683,205 B2 | 3/2014 | Resch et al. |
| 8,751,599 B2 | 6/2014 | Tran et al. |
| 8,751,740 B1 | 6/2014 | De Forest et al. |
| 8,751,897 B2 | 6/2014 | Borthakur et al. |
| 8,799,746 B2 | 8/2014 | Baker et al. |
| 8,832,234 B1 | 9/2014 | Brooker et al. |
| 8,856,619 B1 | 10/2014 | Cypher |
| 8,856,624 B1 | 10/2014 | Paniconi |
| 8,972,478 B1 | 3/2015 | Storer et al. |
| 9,003,086 B1 | 4/2015 | Schuller et al. |
| 9,021,296 B1 | 4/2015 | Kiselev et al. |
| 9,037,825 B1 * | 5/2015 | Donlan .................. G06F 11/00 711/166 |
| 9,052,942 B1 | 6/2015 | Barber et al. |
| 9,063,838 B1 | 6/2015 | Boyle et al. |
| 9,098,447 B1 | 8/2015 | Donlan et al. |
| 9,208,009 B2 | 12/2015 | Resch et al. |
| 9,218,135 B2 | 12/2015 | Miller et al. |
| 9,244,761 B2 | 1/2016 | Yekhanin et al. |
| 9,268,783 B1 | 2/2016 | Shilane et al. |
| 9,274,903 B1 | 3/2016 | Garlapati et al. |
| 9,280,430 B2 | 3/2016 | Sarfare et al. |
| 9,405,483 B1 | 8/2016 | Wei et al. |
| 9,477,682 B1 | 10/2016 | Bent et al. |
| 9,495,241 B2 | 11/2016 | Flynn et al. |
| 9,619,256 B1 | 4/2017 | Natanzon et al. |
| 9,641,615 B1 | 5/2017 | Robins et al. |
| 9,665,428 B2 | 5/2017 | Vairavanathan et al. |
| 9,747,057 B1 | 8/2017 | Ramani et al. |
| 9,817,713 B2 | 11/2017 | Gupta et al. |
| 9,864,527 B1 | 1/2018 | Srivastav et al. |
| 9,942,084 B1 | 4/2018 | Sorenson, III |
| 10,001,947 B1 | 6/2018 | Chatterjee et al. |
| 10,007,561 B1 | 6/2018 | Pudipeddi et al. |
| 10,055,145 B1 | 8/2018 | Danilov et al. |
| 10,061,668 B1 | 8/2018 | Lazier et al. |
| 10,108,819 B1 | 10/2018 | Donlan et al. |
| 10,127,234 B1 | 11/2018 | Krishnan et al. |
| 10,216,770 B1 | 2/2019 | Kulesza et al. |
| 10,242,022 B1 | 3/2019 | Jain et al. |
| 10,282,262 B2 | 5/2019 | Panara et al. |
| 10,289,488 B1 | 5/2019 | Danilov et al. |
| 10,331,516 B2 | 6/2019 | Danilov et al. |
| 10,361,810 B2 | 7/2019 | Myung et al. |
| 10,387,546 B1 | 8/2019 | Duran et al. |
| 10,496,330 B1 | 12/2019 | Bernat et al. |
| 10,503,611 B1 | 12/2019 | Srivastav et al. |
| 10,567,009 B2 | 2/2020 | Yang et al. |
| 10,579,490 B2 | 3/2020 | Danilov et al. |
| 10,613,780 B1 | 4/2020 | Naeni et al. |
| 10,644,408 B2 | 5/2020 | Sakai et al. |
| 10,705,911 B2 | 7/2020 | Vishnumolakala et al. |
| 10,733,053 B1 | 8/2020 | Miller et al. |
| 10,740,183 B1 | 8/2020 | Blaum et al. |
| 10,797,863 B2 | 10/2020 | Chen et al. |
| 10,846,003 B2 | 11/2020 | Danilov et al. |
| 2002/0166026 A1 | 11/2002 | Ulrich et al. |
| 2002/0191311 A1 | 12/2002 | Ulrich et al. |
| 2005/0080982 A1 | 4/2005 | Vasilevsky et al. |
| 2005/0088318 A1 | 4/2005 | Liu et al. |
| 2005/0108775 A1 | 5/2005 | Bachar et al. |
| 2005/0140529 A1 | 6/2005 | Choi et al. |
| 2005/0234941 A1 | 10/2005 | Watanabe |
| 2006/0047896 A1 | 3/2006 | Nguyen et al. |
| 2006/0075007 A1 | 4/2006 | Anderson et al. |
| 2006/0143508 A1 | 6/2006 | Mochizuki et al. |
| 2006/0265211 A1 | 11/2006 | Canniff et al. |
| 2007/0076321 A1 | 4/2007 | Takahashi et al. |
| 2007/0239759 A1 | 10/2007 | Shen et al. |
| 2007/0250674 A1 | 10/2007 | Findberg et al. |
| 2008/0222480 A1 | 9/2008 | Huang et al. |
| 2008/0222481 A1 | 9/2008 | Huang et al. |
| 2008/0244353 A1 | 10/2008 | Dholakia et al. |
| 2008/0320061 A1 | 12/2008 | Aszmann et al. |
| 2009/0070771 A1 | 3/2009 | Yuyitung et al. |
| 2009/0113034 A1 | 4/2009 | Krishnappa et al. |
| 2009/0172464 A1 | 7/2009 | Byrne et al. |
| 2009/0183056 A1 | 7/2009 | Aston |
| 2009/0204959 A1 | 8/2009 | Anand et al. |
| 2009/0240880 A1 | 9/2009 | Kawaguchi |
| 2009/0259882 A1 | 10/2009 | Shellhamer |
| 2010/0031060 A1 | 2/2010 | Chew et al. |
| 2010/0094963 A1 | 4/2010 | Zuckerman et al. |
| 2010/0174968 A1 | 7/2010 | Charles et al. |
| 2010/0218037 A1 | 8/2010 | Swartz et al. |
| 2010/0293348 A1 | 11/2010 | Ye et al. |
| 2010/0332748 A1 | 12/2010 | Van Der Goot et al. |
| 2011/0029836 A1 | 2/2011 | Dhuse et al. |
| 2011/0106972 A1 | 5/2011 | Grube et al. |
| 2011/0107165 A1 | 5/2011 | Resch et al. |
| 2011/0138148 A1 | 6/2011 | Friedman et al. |
| 2011/0161712 A1 | 6/2011 | Athalye et al. |
| 2011/0196833 A1 | 8/2011 | Drobychev et al. |
| 2011/0246503 A1 | 10/2011 | Bender et al. |
| 2011/0292054 A1 | 12/2011 | Boker et al. |
| 2012/0023291 A1 | 1/2012 | Zeng et al. |
| 2012/0096214 A1 | 4/2012 | Lu et al. |
| 2012/0191675 A1 | 7/2012 | Kim et al. |
| 2012/0191901 A1 | 7/2012 | Norair |
| 2012/0204077 A1 | 8/2012 | D'Abreu et al. |
| 2012/0233117 A1 | 9/2012 | Holt et al. |
| 2012/0311395 A1 | 12/2012 | Leggette et al. |
| 2012/0317234 A1 | 12/2012 | Bohrer et al. |
| 2012/0321052 A1 | 12/2012 | Morrill et al. |
| 2013/0047187 A1 | 2/2013 | Frazier et al. |
| 2013/0054822 A1 | 2/2013 | Mordani et al. |
| 2013/0067159 A1 | 3/2013 | Mehra |
| 2013/0067187 A1 | 3/2013 | Moss et al. |
| 2013/0088501 A1 | 4/2013 | Fell |
| 2013/0097470 A1 | 4/2013 | Hwang et al. |
| 2013/0145208 A1 | 6/2013 | Yen et al. |
| 2013/0238932 A1 | 9/2013 | Resch |
| 2013/0246876 A1 | 9/2013 | Manssour et al. |
| 2013/0290482 A1 | 10/2013 | Leggette |
| 2013/0305365 A1 | 11/2013 | Rubin et al. |
| 2014/0040417 A1 | 2/2014 | Galdwin et al. |
| 2014/0064048 A1 | 3/2014 | Cohen et al. |
| 2014/0115182 A1 | 4/2014 | Sabaa et al. |
| 2014/0164430 A1 | 6/2014 | Hadjieleftheriou et al. |
| 2014/0164694 A1 | 6/2014 | Storer |
| 2014/0250450 A1 | 9/2014 | Yu et al. |
| 2014/0280375 A1 | 9/2014 | Rawson et al. |
| 2014/0281804 A1 | 9/2014 | Resch |
| 2014/0297955 A1 | 10/2014 | Yamazaki et al. |
| 2014/0331100 A1 | 11/2014 | Dhuse et al. |
| 2014/0358972 A1 | 12/2014 | Guarrieri et al. |
| 2014/0359244 A1 | 12/2014 | Chambliss et al. |
| 2014/0380088 A1 | 12/2014 | Bennett et al. |
| 2014/0380125 A1 | 12/2014 | Calder et al. |
| 2014/0380126 A1 | 12/2014 | Yekhanin et al. |
| 2015/0006846 A1 | 1/2015 | Youngworth |
| 2015/0074065 A1 | 3/2015 | Christ et al. |
| 2015/0112951 A1 | 4/2015 | Narayanamurthy et al. |
| 2015/0134626 A1 | 5/2015 | Theimer et al. |
| 2015/0142863 A1 | 5/2015 | Yuen et al. |
| 2015/0178007 A1 | 6/2015 | Moisa et al. |
| 2015/0186043 A1 | 7/2015 | Kesselman et al. |
| 2015/0269025 A1 | 9/2015 | Krishnamurthy et al. |
| 2015/0303949 A1 | 10/2015 | Jafarkhani et al. |
| 2015/0331766 A1 | 11/2015 | Sarfare et al. |
| 2015/0370656 A1 | 12/2015 | Tsafrir et al. |
| 2015/0378542 A1 | 12/2015 | Saito et al. |
| 2016/0011935 A1 | 1/2016 | Luby |
| 2016/0011936 A1 | 1/2016 | Luby |
| 2016/0055054 A1 | 2/2016 | Patterson, III et al. |
| 2016/0162378 A1 | 6/2016 | Garlapati et al. |
| 2016/0169692 A1 | 6/2016 | Gupta |
| 2016/0170668 A1 | 6/2016 | Mehra |

(56) References Cited

U.S. PATENT DOCUMENTS

| | | |
|---|---|---|
| 2016/0217104 A1 | 7/2016 | Kamble et al. |
| 2016/0232055 A1 | 8/2016 | Vairavanathan et al. |
| 2016/0253400 A1 | 9/2016 | McAlister et al. |
| 2016/0277497 A1 | 9/2016 | Bannister et al. |
| 2016/0292429 A1 | 9/2016 | Bannister et al. |
| 2016/0294419 A1* | 10/2016 | Sandell .................. G06F 3/064 |
| 2016/0328295 A1 | 11/2016 | Baptist et al. |
| 2016/0357443 A1 | 12/2016 | Li et al. |
| 2016/0357649 A1 | 12/2016 | Karrotu et al. |
| 2016/0371145 A1 | 12/2016 | Akutsu et al. |
| 2016/0378624 A1 | 12/2016 | Jenkins, Jr. et al. |
| 2016/0380650 A1 | 12/2016 | Calder et al. |
| 2017/0003880 A1 | 1/2017 | Fisher et al. |
| 2017/0004044 A1 | 1/2017 | Tormasov et al. |
| 2017/0017671 A1 | 1/2017 | Baptist et al. |
| 2017/0031945 A1 | 2/2017 | Sarab et al. |
| 2017/0097875 A1 | 4/2017 | Jess et al. |
| 2017/0102993 A1 | 4/2017 | Hu et al. |
| 2017/0116088 A1 | 4/2017 | Anami et al. |
| 2017/0187398 A1 | 6/2017 | Trusov |
| 2017/0187766 A1 | 6/2017 | Zheng et al. |
| 2017/0206025 A1 | 7/2017 | Viswanathan |
| 2017/0206135 A1 | 7/2017 | Zeng |
| 2017/0212680 A1 | 7/2017 | Waghulde |
| 2017/0212845 A1 | 7/2017 | Conway |
| 2017/0235507 A1 | 8/2017 | Sinha et al. |
| 2017/0262187 A1 | 9/2017 | Manzanares et al. |
| 2017/0268900 A1 | 9/2017 | Nicolaas et al. |
| 2017/0285952 A1 | 10/2017 | Danilov et al. |
| 2017/0286009 A1 | 10/2017 | Danilov et al. |
| 2017/0286436 A1 | 10/2017 | Neporada et al. |
| 2017/0286516 A1 | 10/2017 | Horowitz et al. |
| 2017/0288701 A1 | 10/2017 | Slik |
| 2017/0344285 A1 | 11/2017 | Choi et al. |
| 2018/0052744 A1 | 2/2018 | Chen et al. |
| 2018/0063213 A1 | 3/2018 | Bevilacqua-Linn et al. |
| 2018/0074881 A1 | 3/2018 | Burden |
| 2018/0121286 A1 | 5/2018 | Sipos |
| 2018/0129417 A1 | 5/2018 | Sivasubramanian et al. |
| 2018/0181324 A1 | 6/2018 | Danilov et al. |
| 2018/0181475 A1 | 6/2018 | Danilov et al. |
| 2018/0181612 A1 | 6/2018 | Danilov et al. |
| 2018/0246668 A1 | 8/2018 | Sakashita et al. |
| 2018/0267856 A1 | 9/2018 | Hayasaka et al. |
| 2018/0267985 A1 | 9/2018 | Badey et al. |
| 2018/0306600 A1 | 10/2018 | Nicolaas et al. |
| 2018/0307560 A1 | 10/2018 | Vishnumolakala et al. |
| 2018/0341662 A1 | 11/2018 | He |
| 2018/0375936 A1 | 12/2018 | Chirammal et al. |
| 2019/0028179 A1 | 1/2019 | Kalhan |
| 2019/0034084 A1 | 1/2019 | Nagarajan et al. |
| 2019/0043201 A1 | 2/2019 | Strong et al. |
| 2019/0043351 A1 | 2/2019 | Yang et al. |
| 2019/0050301 A1 | 2/2019 | Juniwal et al. |
| 2019/0065092 A1 | 2/2019 | Shah et al. |
| 2019/0065310 A1 | 2/2019 | Rozas |
| 2019/0114223 A1 | 4/2019 | Pydipaty et al. |
| 2019/0205437 A1 | 7/2019 | Larson et al. |
| 2019/0215017 A1 | 7/2019 | Danilov et al. |
| 2019/0220207 A1 | 7/2019 | Lingarajappa |
| 2019/0356416 A1 | 11/2019 | Yanovsky et al. |
| 2019/0384500 A1 | 12/2019 | Danilov et al. |
| 2019/0386683 A1 | 12/2019 | Danilov et al. |
| 2020/0026810 A1 | 1/2020 | Subramaniam et al. |
| 2020/0042178 A1* | 2/2020 | Danilov ................ G06F 3/0607 |
| 2020/0050510 A1 | 2/2020 | Chien et al. |
| 2020/0104377 A1 | 4/2020 | Earnesty, Jr. et al. |
| 2020/0117556 A1 | 4/2020 | Zou et al. |

OTHER PUBLICATIONS

Notice of Allowance received U.S. Appl. No. 16/228,612 dated Oct. 20, 2020, 84 pages.

Zhou, et al. "Fast Erasure Coding for Data Storage: A Comprehensive Study of the Acceleration Techniques" Proceedings of the 17th Usenix Conference on File and Storage Technologies (FAST '19), [https://www.usenix.org/conference/fast19/presentation/zhou], Feb. 2019, Boston, MA, USA. 14 pages.

Non-Final Office Action received for U.S. Appl. No. 16/010,255 dated Oct. 29, 2020, 65 pages.

Final Office Action received for U.S. Appl. No. 16/240,272 dated Oct. 27, 2020, 42 pages.

Non-Final Office Action received for U.S. Appl. No. 16/399,902 dated Oct. 28, 2020, 83 pages.

Notice of Allowance received for U.S. Appl. No. 16/374,726 dated Nov. 20, 2020, 78 pages.

Final Office Action received for U.S. Appl. No. 16/228,624 dated Dec. 1, 2020, 63 pages.

Non-Final Office Action received for U.S. Appl. No. 16/570,657 dated Nov. 27, 2020, 75 pages.

Final Office Action received for U.S. Appl. No. 16/177,285 dated Dec. 30, 2020, 61 pages.

Final Office Action received for U.S. Appl. No. 16/511,161 dated Dec. 30, 2020, 61 pages.

Non-Final Office Action received for U.S. Appl. No. 16/399,895 dated Jan. 4, 2021, 64 pages.

Notice of Allowance received for U.S. Appl. No. 16/374,726 dated Jan. 6, 2021, 56 pages.

Non-Final Office Action received for U.S. Appl. No. 16/209,185 dated Jun. 18, 2020, 22 pages.

Martin Hosken, Developing a Hyper-Converged Storage Strategy for VMware vCloud Director with VMware vSAN, Jan. 2018 (Year: 2018).

Non-Final Office Action received for U.S. Appl. No. 16/261,549 dated Apr. 15, 2020, 22 pages.

Non-Final Office Action received for U.S. Appl. No. 16/374,726 dated Jun. 2, 2020, 47 pages.

Natarajan, RAID 0, RAID 1, RAID 5, RAID 10 Explained with Diagrams, Aug. 10, 2010, thegeekstuff.corn (18 pages).

Non-Final Office Action received for U.S. Appl. No. 16/177,285 dated Jul. 22, 2020, 31 pages.

Non-Final Office Action received for U.S. Appl. No. 16/261,547 dated Sep. 3, 2020, 26 pages.

Non-Final Office Action received for U.S. Appl. No. 16/261,548 dated Aug. 21, 2020, 42 pages.

Notice of Allowance received for U.S. Appl. No. 16/261,549 dated Jul. 17, 2020, 40 pages.

Qiang et al., "Dynamics Process of Long-running Allocation/Collection in Linear Storage Space", International Conference on Networking, Architecture, and Storage (NAS 2007), Guilin, 2007, pp. 209-216.

Non-Final Office Action received for U.S. Appl. No. 16/374,725 dated Aug. 19, 2020, 50 pages.

Non-Final Office Action received for U.S. Appl. No. 16/511,161 dated Jul. 10, 2020, 24 pages.

Notice of Allowance received for U.S. Appl. No. 15/862,547 dated Mar. 29, 2019 27 pages.

Non-Final Office Action received for U.S. Appl. No. 15/792,714 dated Apr. 4, 2019, 20 pages.

Final Office Action received for U.S. Appl. No. 15/792,714 dated Sep. 12, 2019, 43 pages.

Wikipedia "Garbage Collection", URL: https://en.wikipedia.org/wiki/Garbage_collection_(computer science)#Availability (Year: 2017) retrieved using the WayBackMachine, Sep. 8, 2017, 8 pages.

Wikipedia "Erasure code", URL: https://web.archive.org/web/20170908171158/https://en.wikipedia.org/wiki/Erasure_code (Year: 2017), retrieved using the WayBackMachine, Sep. 8, 2017, 5 pages.

Wikipedia "Front and back ends" URL: https://en.wikipedia.org/wiki/Front_and_back_ends (Year:2019), Sep. 6, 2019, 4 pages.

Notice of Allowance received for U.S. Appl. No. 15/792,714 dated Nov. 8, 2019, 31 pages.

Non-Final Office Action received for U.S. Appl. No. 15/791,390 dated Sep. 20, 2019, 27 pages.

Final Office Action received for U.S. Appl. No. 15/791,390 dated Feb. 6, 2020, 29 pages.

Non-Final Office Action received for U.S. Appl. No. 15/791,390 dated Apr. 30, 2020, 48 pages.

(56) References Cited

OTHER PUBLICATIONS

Huang et al., "Scale-RS: An Efficient Scaling Scheme for RS-Coded Storage Clusters," in IEEE Transactions on Parallel and Distributed Systems, vol. 26, No. 6, pp. 1704-1717, Jun. 1, 2015.
Non-Final Office Action received for U.S. Appl. No. 16/457,615 dated Jul. 20, 2020, 34 pages.
Non-Final Office Action received for U.S. Appl. No. 16/228,624 dated Jun. 24, 2020, 65 pages.
Non-Final Office Action received for U.S. Appl. No. 16/240,272 dated Jun. 29, 2020, 64 pages.
Non-Final Office Action received for U.S. Appl. No. 16/228,612 dated Jun. 29, 2020, 62 pages.
Final Office Action received for U.S. Appl. No. 16/010,255 dated Jul. 23, 2020, 36 pages.
Office Action received for U.S. Appl. No. 16/010,246 dated Jul. 27, 2020 36 pages.
Office Action received for U.S. Appl. No. 16/177,278, dated Aug. 21, 2020, 53 pages.
Office Action received for U.S. Appl. No. 16/179,486, dated Aug. 13, 2020, 64 pages.
Guo et al., "GeoScale: Providing Geo-Elasticity in Distributed Clouds" 2016 IEEE International Conference on Cloud Engineering, 4 pages.
Guo et al., "Providing Geo-Elasticity in Geographically Distributed Clouds". ACM Transactions on Internet Technology, vol. 18, No. 3, Article 38. Apr. 2018. 27 pages.
Office Action received for U.S. Appl. No. 16/254,073, dated Aug. 18, 2020, 62 pages.
Non-Final Office Action received for U.S. Appl. No. 15/651,504 dated Mar. 21, 2019, 10 pages.
Non-Final Office Action received for U.S. Appl. No. 15/662,273 dated Nov. 16, 2018, 19 pages.
Final Office Action received for U.S. Appl. No. 15/662,273 dated May 15, 2019, 33 pages.
Non-Final Office Action received for U.S. Appl. No. 15/965,479 dated Apr. 15, 2019, 21 pages.
Non-Final Office Action received for U.S. Appl. No. 15/794,950 dated Jul. 9, 2019, 29 pages.
Final Office Action received for U.S. Appl. No. 15/651,504 dated Sep. 18, 2019, 15 pages.
Non-Final Office Action received for U.S. Appl. No. 15/952,179 dated Sep. 10, 2019, 42 pages.
Wikipedia, "Standard Raid Levels—RAID 6", URL: https://en.wikipedia.org/wiki/Standard_RAID_levels#RAID_6, Oct. 18, 2019, 11 pages.
Non-Final Office Action received for U.S. Appl. No. 15/656,382 dated Nov. 1, 2019, 47 pages.
Final Office Action received for U.S. Appl. No. 15/952,179 dated Nov. 26, 2019, 53 pages.
Non Final Office Action received for U.S. Appl. No. 16/024,314 dated Nov. 25, 2019, 42 pages.
Non-Final Office Action received for U.S. Appl. No. 16/177,278 dated Dec. 2, 2019, 55 pages.
Non-Final Office Action received for U.S. Appl. No. 15/651,504 dated Dec. 31, 2019, 18 pages.
Non-Final Office Action received for U.S. Appl. No. 16/010,246 dated Dec. 5, 2019, 67 pages.
Stonebreaker et al. "Distributed RAID—A New Multiple Copy Algorithm.", IEEE ICDE, 1990, pp. 430-437.
Muralidhar et al. "f4: Facebook's Warm BLOB Storage System", USENIX. OSDI, Oct. 2014, pp. 383-398.
Final Office Action dated Feb. 12, 2020 for U.S. Appl. No. 16/024,314, 29 pages.
Non-Final Office Action received for U.S. Appl. No. 16/010,255 dated Jan. 9, 2020, 31 pages.
Office Action dated Feb. 5, 2020 for U.S. Appl. No. 16/261,551, 30 pages.
Non-Final Office Action received for U.S. Appl. No. 16/228,612 dated Feb. 27, 2020, 49 pages.
Final Office Action received for U.S. Appl. No. 16/010,246 dated Mar. 16, 2020, 33 pages.
Final Office Action received for U.S. Appl. No. 15/656,382 dated Apr. 6, 2020, 31 pages.
Non-Final Office Action received for U.S. Appl. No. 15/582,167 dated Sep. 7, 2018, 19 pages.
Non-Final Office Action received for U.S. Appl. No. 15/952,179 dated Apr. 20, 2020, 68 pages.
Notice of Allowance dated May 4, 2020 for U.S. Appl. No. 16/240,193, 46 pages.
Office Action dated May 11, 2020 for U.S. Appl. No. 16/177,278, 53 pages.
Office Action dated May 8, 2020 for U.S. Appl. No. 16/231,018, 78 pages.
Notice of Allowance dated May 11, 2020 for U.S. Appl. No. 16/240,193, 24 pages.
Non-Final Office Action received for U.S. Appl. No. 16/399,897 dated Feb. 19, 2021, 56 pages.
Non-Final Office Action received for U.S. Appl. No. 16/670,715 dated Mar. 31, 2021, 60 pages.
Final Office Action received for U.S. Appl. No. 16/177,278 dated Feb. 24, 2021, 109 pages.
EMC; "EMC ECS (Elastic Cloud Storage) Architectural Guide v2.x", URL : https://www.dell.com/community/s/vjauj58549/attachments/vjauj58549/solutions-ch/477/1/h14071-ecs-architectural-guide-wp.pdf,Jun. 2015, 21 pages.
Mohan et al., "Geo-aware erasure coding for high-performance erasure-coded storage clusters", Springer Link, URL: https://link.springer.com/article/10.1007/s 12243-017-0623-2, Jan. 18, 2018.
Final Office Action received for U.S. Appl. No. 16/179,486 dated Jan. 28, 2021, 55 pages.
Dell Technologies, "ECS Overview and Architecture", h14071.18, Feb. 2021, 55 Pages.
Non-Final Office Action received for U.S. Appl. No. 16/177,285 dated Apr. 9, 2021, 41 pages.
Non-Final Office Action received for U.S. Appl. No. 16/779,208 dated Apr. 20, 2021, 71 pages.
Notice of Allowance received for U.S. Appl. No. 16/726,428 dated Jun. 14, 2021, 34 pages.
Non-Final Office Action received for U.S. Appl. No. 16/698,096 dated May 24, 2021, 62 pages.
Non-Final Office Action received for U.S. Appl. No. 16/745,855 dated May 13, 2021, 71 pages.
Non-Final Office Action received for U.S. Appl. No. 16/834,649 dated Jun. 24, 2021, 61 pages.
Non-Final Office Action received for U.S. Appl. No. 16/179,486 dated May 12, 2021, 50 pages.
Non-Final Office Action received for U.S. Appl. No. 16/570,657 dated May 12, 2021, 79 pages.
Non-Final Office Action received for U.S. Appl. No. 16/670,765 dated Jul. 20, 2021, 79 pages.
Thomasian et al., "Hierarchical RAID: Design, performance, reliability, and recovery", J. Parallel Distrib. Comput. vol. 72 (2012) pp. 1753-1769.

* cited by examiner $$600 \longrightarrow CM = \begin{vmatrix} X_{1,1} & X_{1,2} & X_{1,3} & X_{1,4} & X_{1,5} & X_{1,6} & X_{1,7} & X_{1,8} \\ X_{2,1} & X_{2,2} & X_{2,3} & X_{2,4} & X_{2,5} & X_{2,6} & X_{2,7} & X_{2,8} \end{vmatrix}$$

$$602 \longrightarrow CM = \begin{vmatrix} X_{1,1} & X_{1,2} & X_{1,3} & X_{1,4} \\ X_{2,1} & X_{2,2} & X_{2,3} & X_{2,4} \end{vmatrix}$$

$$604 \longrightarrow CM = \begin{vmatrix} X_{1,5} & X_{1,6} & X_{1,7} & X_{1,8} \\ X_{2,5} & X_{2,6} & X_{2,7} & X_{2,8} \end{vmatrix}$$

FIG. 6

CONSOLIDATION OF PROTECTION SETS IN A GEOGRAPHICALLY DIVERSE DATA STORAGE ENVIRONMENT

TECHNICAL FIELD

The disclosed subject matter relates to data recovery, more particularly, to recovering data of a data chunk stored via a geographically diverse data storage system, wherein the geographically diverse data storage system employs erasure coding technology.

BACKGROUND

Conventional data storage techniques can employ erasure coding of data to conserve storage space for data protection sets and can enabling recovery of data via the data protection set after a portion of the data becomes less accessible. As an example, erasure coding can allow data to be represented in a data protection set stored across a plurality of storage devices that can allow recovery of the data after a storage device of the storage devices becomes less accessible.

BRIEF DESCRIPTION OF DRAWINGS

FIG. 6 is an illustration of example coding matrixes that can be employed by a system to facilitate combining erasure coding code chunks in a geographically diverse storage system that can update an erasure coding scheme, in accordance with aspects of the subject disclosure.

DETAILED DESCRIPTION

Figure 1:
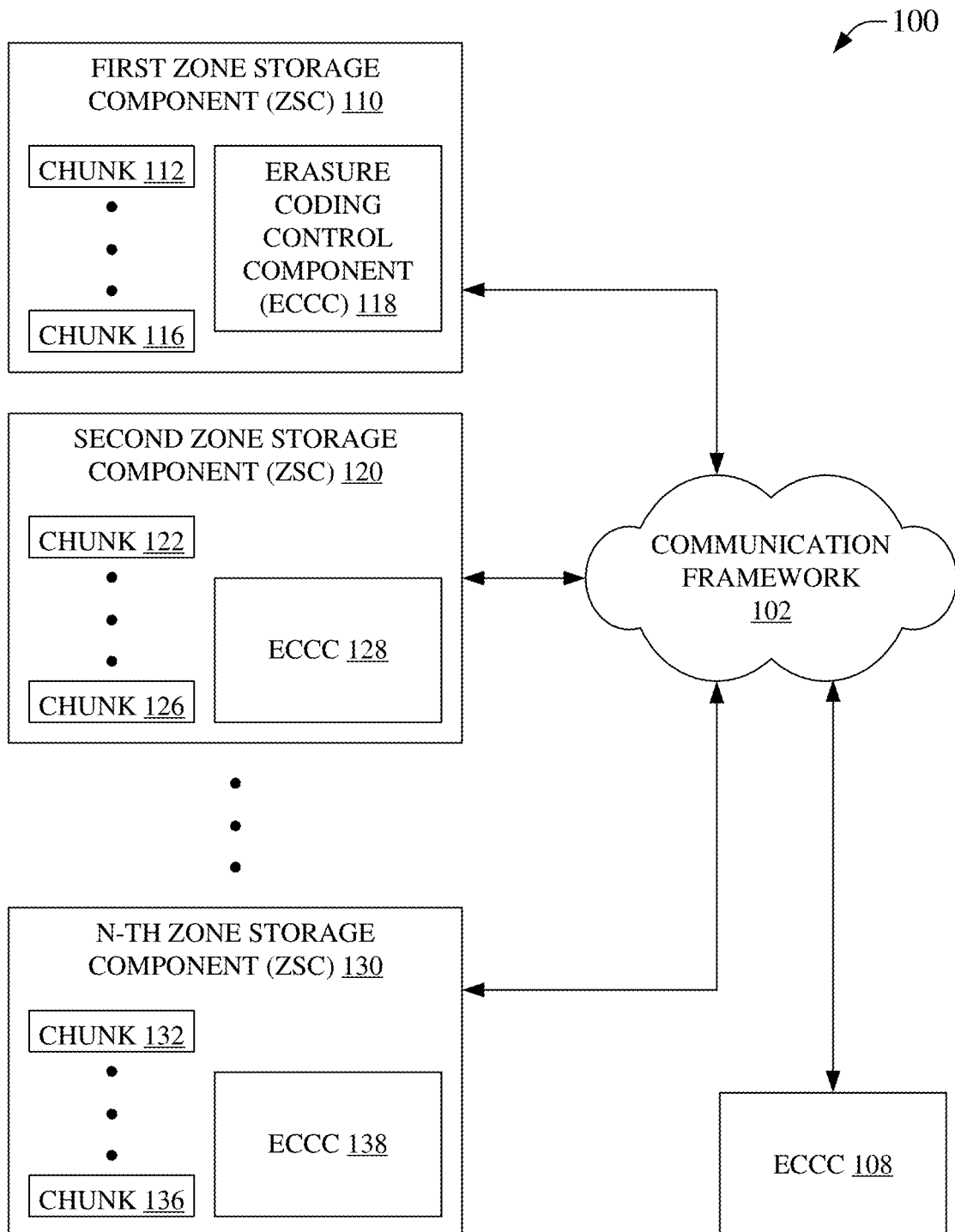
FIG. 1 is an illustration of an example system that can facilitate erasure coding for data chunks in a geographically diverse storage system, in accordance with aspects of the subject disclosure.

The subject disclosure is now described with reference to the drawings, wherein like reference numerals are used to refer to like elements throughout. In the following description, for purposes of explanation, numerous specific details are set forth in order to provide a thorough understanding of the subject disclosure. It may be evident, however, that the subject disclosure may be practiced without these specific details. In other instances, well-known structures and devices are shown in block diagram form in order to facilitate describing the subject disclosure.

As mentioned, data storage techniques can employ erasure coding (EC) to enable recovery of data via a data protection set after a portion of the data becomes less accessible. As an example, erasure coding can allow data to be represented in a data protection set stored across a plurality of storage devices that can allow recovery of the data after a storage device of the storage devices becomes less accessible One use of this type of data storage is in bulk data storage. Examples of bulk data storage can include networked storage, e.g., cloud storage, for example ECS offered by Dell EMC, formerly known as Elastic Cloud Storage by Dell EMC. Bulk storage can, in an aspect, manage disk capacity via partitioning of disk space into blocks of fixed size, frequently referred to as data chunks, chunks, etc., for example a 128 MB chunk, etc. Chunks can be used to store user data, and the chunks can be shared among the same or different users, for example, one chunk may contain fragments of several user objects. A chunk's content can generally be modified in an append-only mode to prevent overwriting of data already added to the chunk. As such, when a typical chunk is determined to be 'full enough,' it can be sealed so that the data therein is generally not available for further modification, e.g., the chunk can designated as immutable. These chunks can be then stored in a geographically diverse manner to allow for recovery of the data where a first copy of the data is destroyed, e.g., disaster recovery, etc. In a non-conventional use of erasure coding, data chunks can be treated as pieces of data that can be erasure coded into a chunk-level data protection set, hereinafter referred to simply as a data protection set, according to an erasure coding scheme such that when a data chunk becomes less accessible the data chunk can be recovered from the remaining accessible portions of the data protection set. As an example, a 4+2 EC scheme can encode four data chunks and two EC chunks in a protection set that can be stored on six different data storage devices and can provide recovery of the four data chunks up to any two of the storage devices becoming less accessible. Chunks, e.g., data chunks, erasure coding chunks, etc., can be stored on data storage device(s), e.g., 'zone storage component' (ZSC), 'zone storage device' (ZSD), etc., located in one or more geographic locations, hereinafter 'zone(s)', etc. As an example, in a 4+2 EC scheme, data protection set chunks can be stored in storage devices of six zones that can be geographically diverse. This can enable recovery of data where any two zones can become less accessible, e.g., damaged, destroyed, offline, etc.

Generally, geographically diverse data storage can store data in a diverse manner to provide data protection, e.g., a cause of reduced accessibility in a first zone can be less likely to also affect a second zone where it is sufficiently geographically diverse. As an example, a storage device in Topeka can store a portion of a protection set and a storage device in Houston can store another portion of the protection set, e.g., Topeka can be considered geographically diverse from Houston, such that, for example, a hurricane in Houston that causes data stored there to become less accessible is unlikely to also cause the data in Topeka to become less accessible. As a second example, data chunks from a protection set can be stored in Seattle, San Jose, and Denver, such that an earthquake in Seattle is less likely to compromise protection set chunks in San Jose and/or Denver. While other data storage techniques, e.g., storing replicas of data in other geographically diverse zones, etc., can also provide data protection, use of erasure coding can consume less storage space across a geographically diverse data storage system, for example, the storage of full replicas can consume more storage space than an EC protection set, e.g., the 'storage overhead,' hereinafter simply overhead, for an EC protection set can be less than the overhead of other data protection technologies. As an example, creating full replicas can double the storage space needed, e.g., an overhead of 100%, in contrast to a 4+2 EC scheme that can have an overhead of 50%, an 16+2 EC scheme that can have an overhead of 12.5%, etc.

In an aspect, a ZSC can comprise one or more data storage components that can be communicatively coupled, e.g., a ZSC can comprise one data store, two or more communicatively coupled data stores, etc. In an aspect, this can allow diverse data storage in as few as one ZSC and can provide data protection in the ZSC, for example, providing protection against loss of one or more data stores of a single ZSC. As an example, a ZSC can comprise multiple hard drives and chunk(s) of the protection set can be stored on one or more hard drive such that, if a hard drive fails, other hard drives of the ZSC can comprise other chunk(s) of the protection set that can facilitate recovery of the chunk stored on the failed hard drive of the ZSC. As such, there can be redundancy in a zone and other redundancy between zones.

Recovery of data from a protection set can, in some instances, be computer resource intensive, e.g., processor, memory, network, storage, etc., intensive. As an example, loss of access to data of a Seattle zone can result in network communication of other protection set data stored at other zones as part of recovering the Seattle zone; can comprise storing communicated protection set data to enable recovery of the Seattle zone data; can comprise use of processor resources to recover the Seattle zone data based on other data fragments/chunks and other erasure coding fragments/chunks, etc. The example Seattle zone data recovery can comprise moving chunks from other zones, for example Houston, Miami, etc., to a Denver zone, storing the other chunks at the Denver zone, and then recovering the Seattle data at the Denver zone from the balance of the protection set now stored at the Denver zone. Moreover, generating EC chunks for a protection set can also consume computing resources. AS an example, generating an EC chunk, moving the EC chunk to a geographically diverse zone, storing the EC chunk at the destination zone, etc. As such, it can be desirable to reduce the computing resource burden associated with use of a protection set in a geographically diverse data storage system. As an example, in some geographically diverse storage systems, zones can be located substantially far apart, for example a Moscow Russia zone, a Seattle USA zone, A Sao Paolo, Brazil zone, etc., and reducing the amount of data access, transfer, etc., involved in data protection can be an important factor in successful deployment of the example geographically diverse storage system.

In an aspect, the presently disclosed subject matter can include 'zones'. A zone can correspond to a geographic location or region. As such, different zones can be associated with different geographic locations or regions. As an example, Zone A can comprise Seattle, Wash., Zone B can comprise Dallas, Tex., and, Zone C can comprise Boston, Mass. In this example, where a chunk from Zone A is protected in part by a chunk stored in Zone C, an earthquake in Seattle can be less likely to damage the chunk in Boston.

Moreover, in an aspect, a chunk can be a convolved chunk, e.g., two data chunks, e.g., chunk A and chunk B, can be convolved in to a convolved data chunk, e.g., chunk C. In an aspect, chunk A and Chunk B can be protected by inclusion in a protection set A, e.g., the data before convolution can be protected via erasure coding, enabling recovery of Chunk A and chunk B from protection set A stored in a geographically diverse manner. In a further aspect, chunk C can be protected by inclusion in a protection set B, e.g., the data after convolution can be protected via erasure coding, enabling recovery of chunk C from protection set B stored in a geographically diverse manner. Recovered chunk C can then be employed to recover chunk A and/or chunk B. This aspect is not further discussed in the subject disclosure for the sake of clarity and brevity.

In an aspect, erasure coding, employed to protect data in a geographically diverse data storage system, can divide a data (D) into k data portions, also termed data segments. It is noted that a full data chunk can be regarded as a data portion, e.g., where four data chunks are regarded as four data portions, then for a 4+2 EC scheme, two EC chunks can be generated such that any two of the now six chunks (four data chunks and two EC chunks) can be lost and the data of the four chunks can be fully recovered. This can be regarded as, during an encoding operation, m redundant coding segments can be created. Encoding can then assure that a loss of any m segments of the k+m segments can be tolerated without loss of data access. If up to m segments are lost or become inaccessible (hereinafter simply 'lost' unless otherwise explicitly indicated otherwise), the missing segments can be restored via a decoding operation. An erasure coding protection scheme can be identified as resulting in k+m data segments, e.g., k data segment and m coding segments (or EC segments, EC chunks, etc.) result for a single data portion of a protection set. As an example, in system having k=12 and m=4, e.g., 12 data chunks and four coding chunks under a 12+4 EC scheme, stored on 16 storage devices, the loss of any four of those storage devices will not compromise the data of the 12 data chunks because they can be fully recovered from the 12 remaining protection set chunks.

Rather than simply duplicating chunks between zones of a geographically diverse data storage system, even with convolution, erasure encoding can reduce the amount of data that needs to be accessed, communicated, processed, stored, etc., to facilitate a designated level of data robustness in the geographically diverse data storage system. For example, without erasure coding, for p+1 geographically distributed zones, there can be manipulation of at least p+1 chunks, which can be computer resource intensive where more than a small number of chunks are compromised. With erasure encoding, the p+1 chunks can be encoded into fewer coding chunks that can consume less storage space and can be communicated/accessed with less computer resources than the p+1 chunks, for example, in a 4+2 erasure coding scheme, two coding chunks can be distributed to provide data protection rather than replicating and storing greater numbers of replicate chunks. Then, in this example, the coding chunks can be used to recover data rather than having to use the larger number of replicate chunks of a non-erasure coding system. Historically, erasure coding was created as a forward error correction method for binary erasure channels. Generally, erasure coding can divide a data portion, into k data fragments of equal size. Where, because data chunks are of equal size, a group of chunks can be treated as the k data fragments, m EC coding fragments of chunk size can be generated, wherein the resulting k+m chunks can be stored as a protection set to provide data protection, more especially when stored in a geographically diverse manner. Where m coding fragments/chunks are created for k data fragments/chunks, access to data of the k data fragments/chunks can be accessible with a loss of up to m fragments/chunks of the k+m fragments/chunks for example, in a 12+4 encoding, data can still be accessed despite the loss of up to four data fragments, four coding fragments, two data and two coding fragments, etc. It can be said that the way the encoding is done can assure that a system can tolerate the loss of any m fragments. The process of generating coding fragments can be referred to as 'encoding.' The process of recovering data fragments from an encoded data portion, e.g., using available data fragments and/or coding fragments, can be termed 'decoding.'

In an embodiment, if a geographically distributed data storage system is designated as being able to tolerate a loss of any m zones/clusters/chunks, Then a first erasure coding scheme can be selected, for example, a 4+2 EC scheme for a system comprising six zones. In an aspect, where the system is scaled-out, e.g., more zones are added, the same EC scheme can still be employed. As an example, where the six-zone system is scaled-out to a 12-zone system, the 4+2 EC scheme can still be used to store a protection set across any six of the 12 zones. In an aspect, it can provide additional storage efficiency to change the EC scheme. As an example, a 4+2 EC scheme can have a 50% overhead and a 10+2 EC scheme can have a 20% overhead. As such, where the example six-zone system is scaled to a 12-zone system, then the system can reduce the storage overhead from 50% to 20% by shifting from the 4+2 EC scheme to the 10+2 EC scheme. However, changing the EC scheme can be associated with re-encoding the protection sets, moving data chunks to be protected, etc. As is disclosed herein, use of complementary protection sets can reduce the demand on computational resources in comparison to the aforementioned re-encoding according to a changed EC scheme. In an embodiment, data to be protected can be moved to other zones in a response to a geographically diverse data storage system scale-out event, this can enable combining complementary protection sets in a manner that can provide protection according to a different EC scheme. As an example, a six-zone system using 4+2 EC to protect two sets of four data chunks can be scaled-out to a 10-zone system using 8+2 EC by moving four data chunks to newly added zones and combining, for example by a matrix addition operation, etc., the corresponding EC chunks, which can result in reducing the storage overhead from 50% (for the 4+2) to 25% (for the 8+2) without needing to explicitly re-encode. It is noted that a protection set can be made complementary to another protection set before combining, e.g., via padding, altering indexing, etc. This aspect is presented in more detail herein below.

EC encoding can be performed by a given zone of a data storage system. A first zone can, for example, encode k chunks comprising chunks replicated to the first zone from other different zones of the geographically diverse data storage system. In an embodiment, the first zone can encoding the k chunks because the size of a chunk is fixed, and data padding or other data complements can be added as needed. Encoding can result in m data portions that can each be the same size as a chunk, e.g., the EC chunks can be the same size as data chunks. In some embodiments, after encoding is complete, the first zone can store one coding chunk locally and move other m−1 coding chunks to remote zones, e.g., making sure the k+m data and coding chunks are stored across k+m different zones, whereupon the copied chunks previously used for encoding, and any peer backup chunks at other zones, can be deleted to save storage space, e.g., storing coding chunks can consume less storage space that storing primary backup and peer backup chunks representing the same data. In an embodiment, per chunk capacity overheads for geographically diverse data storage systems employing a single level of erasure coding can be approximated by: Overhead=m/k*'chunk_size'. As an example, for a 10+2 scheme, the overhead is $\frac{1}{5}^{th}$ of a 'chunk size', and for a 128 MB chunk, the overhead can be (0.2)(128 MB)=25.6 MB.

Recovery of less accessible data under an EC scheme can be resilient against loss of 1 to m chunks. Recovery of the less accessible chunks can be, for example, as follows. For each less available chunk, k peer data chunks and corresponding coding chunks can be used to perform decoding. The resulting data portion(s) can then be stored as replacements for the less accessible chunk(s). It will be noted that this illustrates the recovery of entire less accessible chunks based on entire coding chunks and entire data chunks. It will further be noted that where the number of zones in a geographically diverse data storage system is greater or equal to k+m, and where all the data and coding chunks are effectively distributed among the zones, the distributed storage can be resilient to loss of up to m zones, clusters, or chunks because erasure encoding provides a mechanism to recover compromised chunks.

To the accomplishment of the foregoing and related ends, the disclosed subject matter, then, comprises one or more of the features hereinafter more fully described. The following description and the annexed drawings set forth in detail certain illustrative aspects of the subject matter. However, these aspects are indicative of but a few of the various ways in which the principles of the subject matter can be employed. Other aspects, advantages, and novel features of the disclosed subject matter will become apparent from the following detailed description when considered in conjunction with the provided drawings.

FIG. 1 is an illustration of a system 100, which can facilitate erasure coding for data chunks in a geographically diverse storage system, in accordance with aspects of the subject disclosure. System 100 can comprise zone storage components (ZSCs), e.g., first ZSC 110, second ZSC 120, N-th ZSC 130, etc. The ZSCs can communicate with the other ZSCs of system 100, e.g., via communication framework 102, etc. A zone can correspond to a geographic location or region. As such, different zones can be associated with different geographic locations or regions. A ZSC can comprise one or more data stores in one or more locations. In an aspect, a ZSC can store at least part of a data chunk on at least part of one data storage device, e.g., hard drive, flash memory, optical disk, server storage, etc. Moreover, a ZSC can store at least part of one or more data chunks on one or more data storage devices, e.g., on one or more hard disks, across one or more hard disks, etc. As an example, a ZSC can comprise one or more data storage devices in one or more data storage centers corresponding to a zone, such as a first hard drive in a first location proximate to Miami, a second hard drive also proximate to Miami, a third hard drive proximate to Orlando, etc., where the related portions of the first, second, and third hard drives correspond to, for example, a 'Florida zone', 'Southeastern United States zone', etc.

In an aspect, data chunks, e.g., chunk 112 to chunk 116, 122 to 126, 132 to 136, etc., can be replicated in their source zone, in a geographically diverse zone, in their source zone and one or more geographically diverse zones, etc. As an example, a Seattle zone can comprise a first chunk that can be replicated in the Seattle zone to provide data redundancy in the Seattle zone, e.g., the first chunk can have one or more replicated chunks in the Seattle zone, such as on different storage devices corresponding to the Seattle zone, thereby providing intra-zone data redundancy that can protect the data of the first chunk, for example, where a storage device storing the first chunk or a replicate thereof becomes compromised, the other replicates (or the first chunk itself) can remain uncompromised within the zone. In an aspect, data replication in a zone can be on one or more storage devices, e.g., a chunk can be stored on a first data storage device, a second chunk can be stored on a second storage device, and a third chunk can be stored on a third storage device, wherein the first, second, and third storage devices correspond to the first zone, and wherein the first, second, and third storage devices can be the same storage device or different storage devices. Replication of chunks, e.g., the first chunk, into other chunks can comprise communicating data, e.g., over a network, bus, etc., e.g., communications framework 102, etc., to other data storage locations on the first, second, and third storage devices and, moreover, can consume data storage resources, e.g., drive space, etc., upon replication. Further access, communication, etc., of chunks can consume or burden computing resources of one or more ZSCs, components of communication framework 102, etc., wherein computing resources can comprise processing of operations on one or more processors, use of one or more memories, use of one or more network resources, etc. As such, the number of replicates and/or storage schema can be based on balancing resource costs, e.g., network traffic, processing time, cost of storage space, etc., against a level of data redundancy, e.g., how much redundancy is needed to provide a level of confidence that the data/replicated data will be available.

In an aspect, system 100 can comprise one or more erasure coding control components (ECCC), e.g., ECCC 108, 118, 128, 138, etc. An ECCC can enable erasure coding of data. In an aspect, an ECCC can facilitate one or more erasure coding schemes, for example, a zone erasure coding scheme that encodes at the chunk-level between zones of a geographically diverse data storage system (hereinafter 'GEO'), etc. In an embodiment, ECCC 108 can interact with the ZSCs of system 100 via communication framework 102 to orchestrate erasure coding scheme(s) for system 100. In another embodiment, one or more of ECCCs 108-138 can orchestrate a first erasure coding scheme between ZSCs of system 100, can each orchestrate a second erasure coding scheme within a corresponding ZSC(s) 110, 120, 130, etc., or combinations thereof. Other embodiments are readily appreciated and are to be considered within the scope of the present disclosure even where not explicitly recited for the sake of clarity and brevity.

In an aspect, an ECCC can enable encoding according to an erasure coding scheme. In a further aspect, an ECCC can enable decoding based on an erasure coding scheme. As an example, ECCC 118 can interact with other ECCCs, e.g., 128, 138, 108, etc., to enable erasure decoding of chunks stored among ZSCs 110-130, etc., to recover chunks 112 to 116, etc. Accordingly, this example erasure encoding/decoding can illustrate that the encoding can, in an embodiment, protect against the loss of a whole chunk, a whole zone, etc. Moreover, the example erasure encoding can allow for system 100 to consume fewer computing resources than would otherwise be required to recover a whole chunk to replace a compromised chunk, where recovery of a chunk segment of the compromised chunk would be sufficient to enable access to data represented in the compromised chunk.

Figure 2:
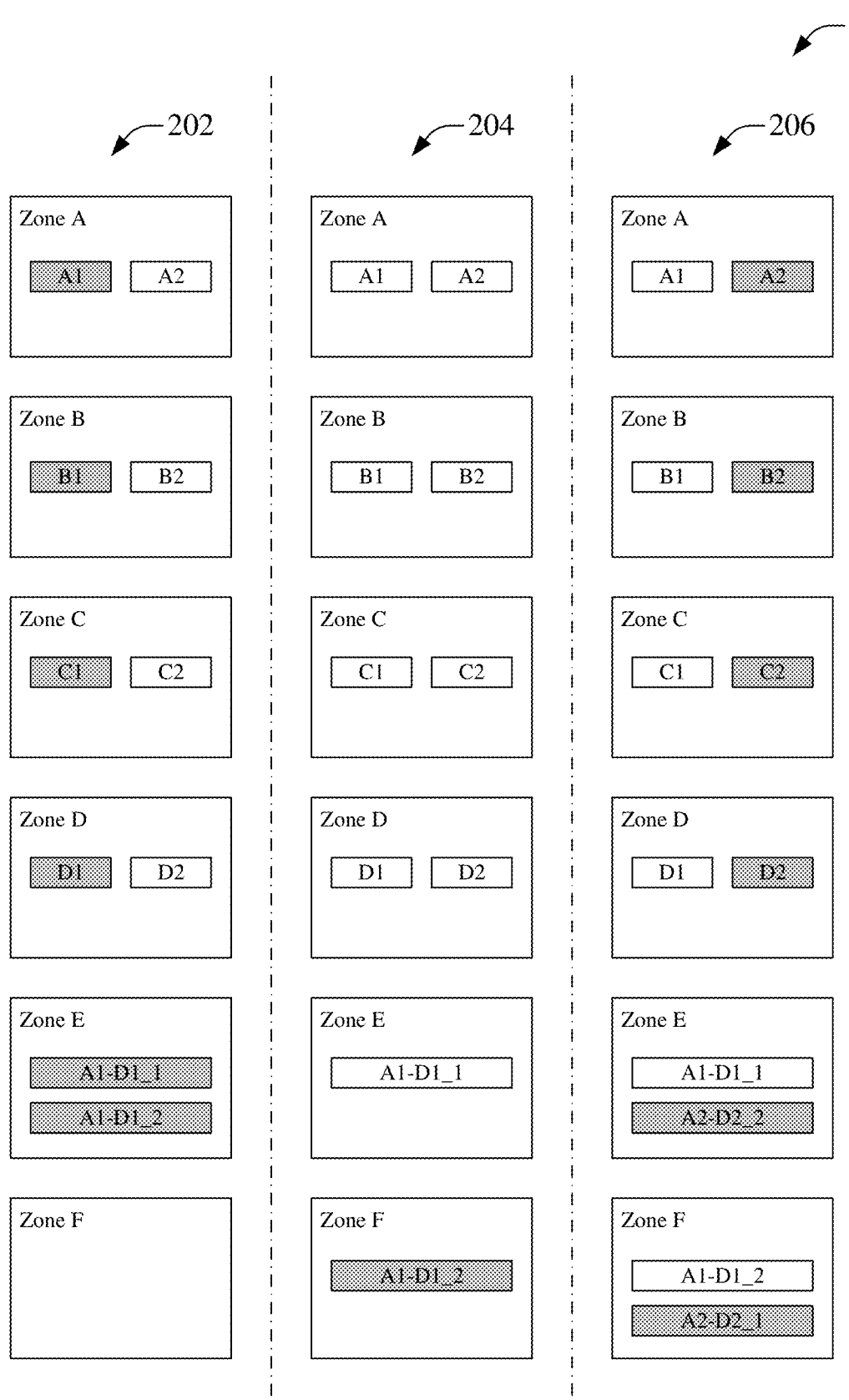
FIG. 2 is an illustration of an example system that can facilitate erasure coding for data chunks in a geographically diverse storage system according to an erasure coding protection scheme, in accordance with aspects of the subject disclosure.

FIG. 2 is an illustration of a system 200, which can enable zone-level erasure coding of data chunks in a geographically diverse storage system employing an erasure coding protection scheme, in accordance with aspects of the subject disclosure. System 200 can comprise a GEO having zones A-F, e.g., six zones. Each of the zones can store a data chunk(s) and/or a EC code chunk(s), e.g., Zone A can store chunks A1, A2, etc., Zone E can store EC chunks A1-D1_1, A1-D1_2, etc. In an aspect, system 200 can comprise one or more erasure coding control components, not illustrated, that can be, for example, similar to, or the same as ECCC 108, 118, 128, 138, etc. Moreover, each of the zones can store other chunks, for example, replicates of chunks from other zones, not illustrated for clarity and brevity. e.g., Zone A can store chunks B2', C1', C2', etc., which can correspondingly be replicates of B2, C1, C2, etc., from other zones, e.g., Zones B-F, etc. An EC code chunk can result from EC encoding of data chunks. As an example, a data chunk can be used to directly store user provided data, e.g., chunk A1, A2, etc., of Zone A in system 200, while an EC code chunk can comprise data that can be used via EC decoding of available data to recover compromised data chunks, e.g., remaining data chunks and/or EC code chunks can be decoded to recover less accessible data chunks.

As can be observed at system state 202 of system 200, the example shaded data chunks of Zones A-D can be employed to generate the example shaded EC code chunks, for example, at Zone E. In an example, Chunks A1 to D1 can be replicated in Zone E and then Zone E can generate A1-D1_1, A1-D1_2, etc., based on the data chunks replicated at Zone E. In this example, A1 to D1, A1-D1_1, and A1-D1_2, can comprise a 4+2 data protection set. However, in this example at system state 202, system has not fully distributed the EC code chunks and some losses of two zones could result in a data loss event. In the example, there is supposed to be protection against the loss of any two zones based on the 4+2 EC scheme illustrated, however, without full distribution of the protection set there is still an opportunity for a data loss event for some losses of two zones, e.g., loss of any one of Zones A to D, in conjunction with a loss of Zone E can result in insufficient remaining chunks to recover less accessible data because both EC code chunks and one data chunk would be lost in these circumstances. As such, distribution of the chunks of the data protection set will improve the ruggedness of the data of system 200, e.g., as illustrated in system state 204.

At system state 204, system 200 can fully distribute the chunks of the data protection set. As is illustrated, shaded EC chunk A1-D1_2 can be moved, copied, etc., from Zone E to Zone F. Accordingly, any copies, replicates, etc., made at system state 202 to enable generation of the EC code chunks can be deleted where system 200, at state 204, now protects data chunks A1 to D1 against the loss of up to any two of Zones A to F. It is noted that protection of data chunks A2 to D2 has not been addressed in system 200 at states 202 or 204. As such, data chunks A2 to D2 can be susceptible to a data loss event where any one or Zones A to D becomes less accessible.

In order to protect data chunks A2 to D2, system 200, at state 206, can generate EC code chunks A2-D2_1 and A2-D2_2 and fully distribute the corresponding data protection set, for example, according to the shaded chunks illustrated in system state 206. Accordingly, at state 206, system 200 can be understood to provide 4+2 EC protection for two sets of data, e.g., chunks A1-D1 and chunks A2-D2, via two protection sets distributed across six zones. As an example, the loss of Zone A can result in chunk A1 (of a first set of data chunks) and chunk A2 (of a second set of data chunks) each becoming less accessible. However, in this example, the remainder of the two corresponding protection sets can be used to recover the less accessible chunks, e.g., corresponding chunks from any four of the remaining five accessible zones B to F can be employed to recover from the example loss of Zone A. As an example, B1, C1, D1, and A1-D1_1 can be employed to recover A1, while B2, D2, A2-D2_2 and A2-D2_2 can be employed to recover A2. Numerous other example permutations of chunks from four of the five remaining zones, in this example, being used to recover each of A1 and A2 will be readily appreciated, and all are considered in the scope of the subject disclosure, even where not recited for clarity and brevity.

System 200, in example system states 202-206, can illustrate protection of multiple sets of data chunks according to a selected EC scheme. In an aspect, even where not explicitly illustrated for the sake of clarity and brevity, other appropriate EC schemes, combinations of EC schemes, etc., can be employed in system 200. As an example, a 4+1 EC scheme can be used for some data sets while a 4+2 EC scheme is employed for other data sets; a 3+2 EC scheme can be used for some data sets while a 5+1 EC scheme is employed for other data sets; 4+2 EC scheme can be used for some data sets while a 5+1 EC scheme is employed for other data sets; etc. While the aspect of employing appropriate EC schemes of combinations thereof, for protection of data sets is to be recognized for all aspects of the subject disclosure, for clarity and brevity, the remainder of the disclosure generally demonstrates advantages of the disclosed technology while uniformly using a homogeneous EC scheme at any given system state, similar to that demonstrated in system 200, e.g., only a 4+2 EC scheme is illustrated for protection of the two illustrated data sets. This is believed to reduce confusion over demonstrating the use of several EC schemes, which is entirely plausible for the disclosed subject matter, at each system state, more especially where portions of the disclosed subject matter demonstrate changing from a first EC scheme to a second EC scheme as a system moves through different system states.

Figure 3:
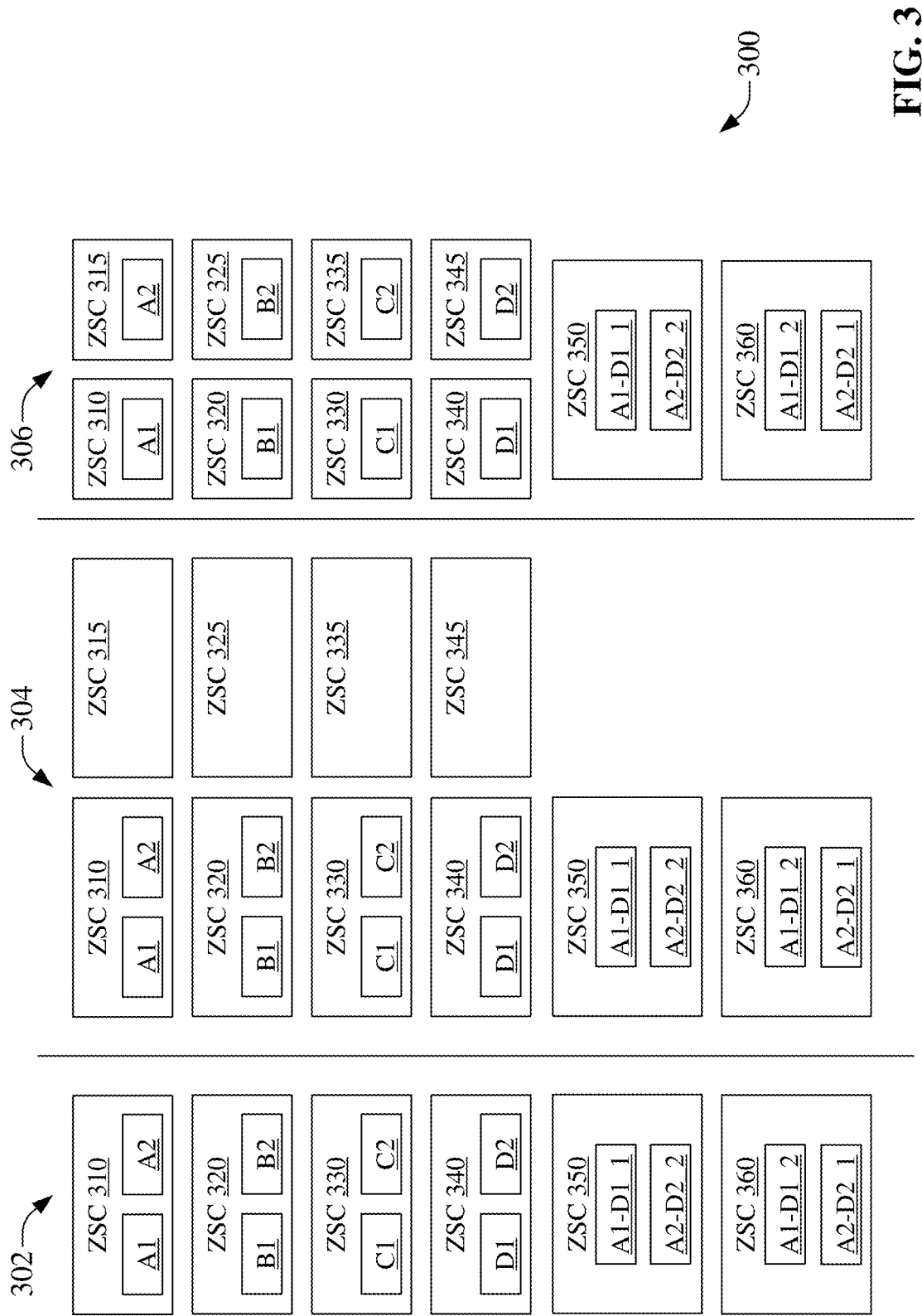
FIG. 3 is an illustration of an example system that can facilitate erasure coding for data chunks, in a geographically diverse storage system undergoing a scale-out event, according to an erasure coding protection scheme, in accordance with aspects of the subject disclosure.

FIG. 3 is an illustration of a system 300, which can facilitate erasure coding for data chunks, in a geographically diverse storage system undergoing a scale-out event, according to an erasure coding protection scheme, in accordance with aspects of the subject disclosure. Similar to, or the same as, system 200, system 300 can comprise one or more erasure coding control components, not illustrated. System 300, at system state 302, can illustrate zone storage components of, for example, six zones of a geographically diverse storage system, e.g., ZSC 310-360, etc. A zone can correspond to a geographic location or region. As such, different zones can be associated with different geographic locations or regions. A ZSC can comprise one or more data stores in one or more locations. Each ZSC can store data, e.g., data chunks, EC code chunks, etc., via one or more storage devices. As an example, ZSCs 310-340 can store data chunks for two data sets, e.g., A1 through D1, A2 through D2, etc. As another example, ZSCs 350 and 360 can store EC code chunks corresponding to the above example two data sets, e.g., A1-D1_1, A2-D2_2, A1-D1_2, A2-D2_2, etc. As illustrated at system state 302, system 300 can provide EC protection of the two example data sets with a 4+2 EC scheme across the six zones of the example geographically diverse storage system.

At system state 304, system 300 can undergo a scaling out event that, for example, can add storage components for four zones, e.g., ZSCs 315 through 345. In an aspect, it can be desirable to redistribute stored data into the added zones. Distributing the stored chunks more broadly can provide benefits, for example, improved access to data, shifting of available storage space between zones, etc. Considering improved access, this can be appreciated by understanding that before redistribution ZSC 310 can comprise data chunk A1 and data chunk A2, such that where ZSC 310 becomes less accessible, access to both A1 and A2 can be compromised. In contrast, where chunk A2 has been moved from ZSC 310 to ZSC 315, access to A2 on ZSC 315 can be unaffected. Moreover, turning to another benefit of redistribution, where ZSC 310, for example, is full by storing A1 and A2, moving A2 to ZSC 315 can result in ZSC 310 having available storage space.

At system state 306, system 300 can illustrate an example redistribution of the data chunks stored in ZSC 310 through 340. It is noted that other redistributions are possible and that all such redistributions are within the scope of the disclosed subject matter even where not recited for clarity and brevity. As examples, not all four of A2 to D2 need to be moved; A1 could be moved instead of A2; B2 can be moved to ZSC 335 and C2 can be moved to ZSC 325; A1-D1_1 can be moved to ZSC 315 and A2 can be moved to ZSC 350; etc. In an aspect, at state 306, the two example data sets, e.g., A1-D1 and A2-D2, remain protected by their corresponding 4+2 data protection sets and being fully distributed. In the illustrated embodiment, chunks A1-D1, correspondingly stored in ZSCs 310-340, can be protected by A1-D1_1 at ZSC 350 and A1-D1_2 at ZSC 360, while chunks A2-D2, correspondingly stored in ZSCs 315-345, can be protected by A2-D2_2 at ZSC 350 and A2-D2_1 at ZSC 360. It is observable that the storage overhead of system 300 at each system state, e.g., 302, 340, and 306, remains at 50% because the EC scheme remains 4+2 in each system state.

Figure 4:
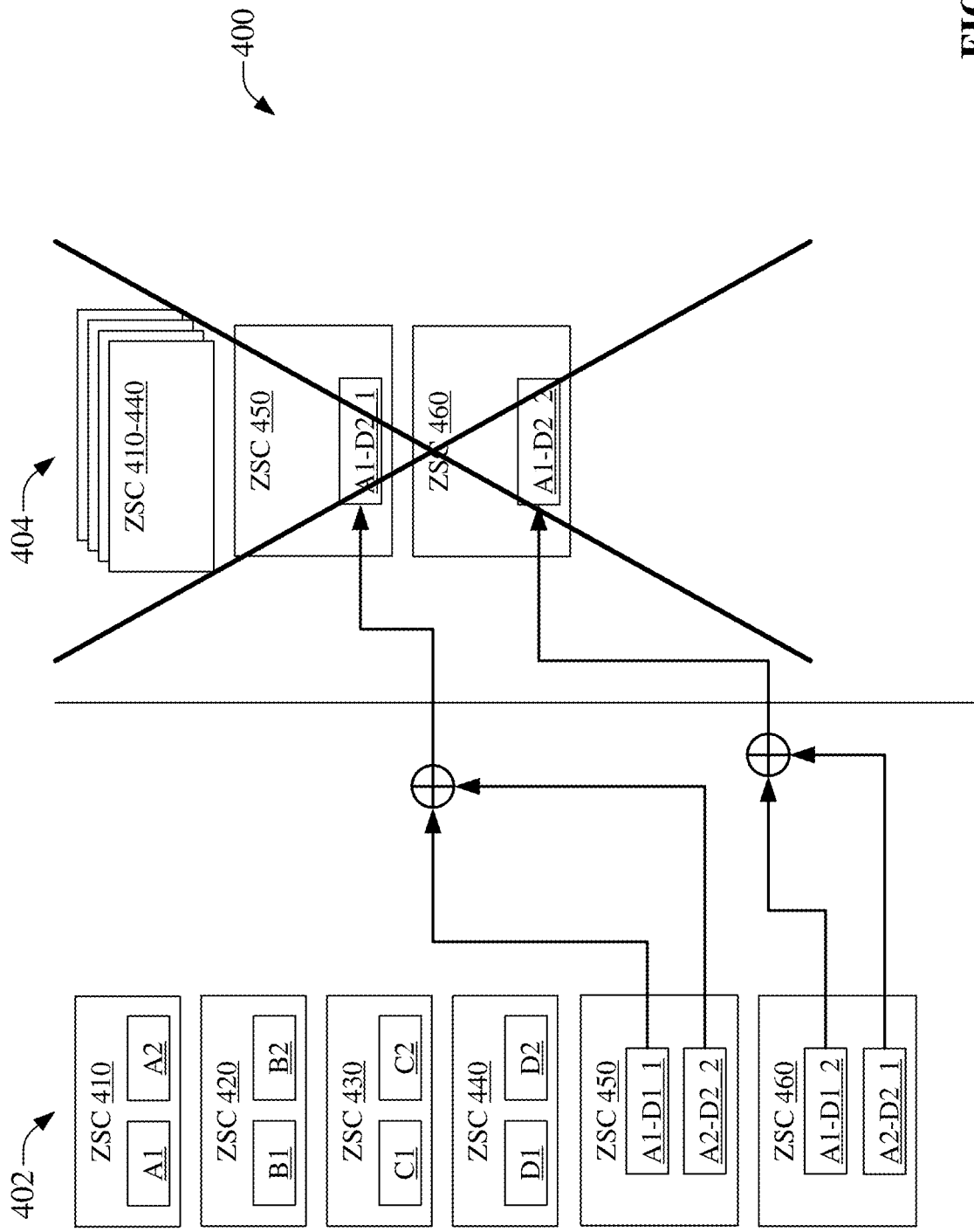
FIG. 4 illustrates an example system that can restrict combining erasure coding code chunks in a geographically diverse storage system employing an erasure coding protection scheme, in accordance with aspects of the subject disclosure.

FIG. 4 is an illustration of a system 400, which can restrict combining erasure coding code chunks in a geographically diverse storage system employing an erasure coding protection scheme, in accordance with aspects of the subject disclosure. System 400, at system state 402, illustrates an example distribution of chunks of two protection sets. Similar to, or the same as, systems 200, 300, etc., system 400 can comprise one or more erasure coding control components, not illustrated; zone storage components of a geographically diverse storage system, e.g., ZSC 310-360, etc.; and chunks of two data protection sets, e.g., chunks A1 to D1, A1-D1_1 and A1-D1_2, chunks A2 to D2, A2-D2_1 and A2-D2_2, etc. As before, a zone can correspond to a geographic location or region. As such, different zones can be associated with different geographic locations or regions. A ZSC can comprise one or more data stores in one or more locations. Each ZSC can store data via one or more storage devices. As illustrated at system state 402, system 400 can provide EC protection of the two example data sets with a 4+2 EC scheme across the six zones of the example geographically diverse storage system.

In an aspect, it can be desirable to conserve data storage space. Accordingly, it can be tempting to want to combine the EC code chunks to conserve data storage space, e.g., by storing one combined chunk rather than two separate chunks. While this can be accomplished in some circumstances, careful consideration of how the protection sets are stored, manipulated, distributed, etc., can illustrate that combining EC code chunks is not always possible while preserving the level of protection associated with a given EC scheme. One of these conditions is illustrated for system state 402.

As is illustrated, an attempt to combine the EC code chunks, e.g., via a unifying operation denoted here by the ⊕ symbol, such as a matrix addition, etc., can cause a potential for a data loss event if system state 404 is achieved. As such, a transition of system 400 from system state 402 to system state 404 can be restricted, prevented, prohibited, etc. In an aspect, combining EC code chunks can reduce the diversity needed to provide the protection associated with the corresponding EC scheme. As an example, where a first 4+2 EC protection set is associated with being resilient against the loss of an any two of the six chunks comprising the first protection set, e.g., four data chunks and two EC code chunks, then reducing the protection set to five chunks, e.g., four data chunks and one EC code chunk embodying data previously comprised in the two EC code chunks, can fail to provide protection against the loss of any two of the five chunks of the resulting protection set. Continuing this example, where the protection set comprises chunks A1 to D1, A1-D1_1 and A1-D1_2, then combining A1-D1_1 and A1-D1_2, not illustrated, can result in a real data loss event because loss of the resulting combined chunk and one data chunk, e.g., two chunks total, can comprise a loss of data corresponding to three chunks of data because the one example combined chunk actually can be viewed as representing two chunks of EC code data. In another example, rather than trying to combine the EC code chunks of one data protection set, trying to combine EC code chunks from different data protection sets, as is illustrated, can cause a similar risk of a data loss event for the illustrated chunk storage configuration.

In this example, assuming for the moment that system state 404 is arguendo permitted, which illustrates the combining of EC code chunks from different protection sets to conserve storage space, e.g., combining A1-D1_1 of the A1 to D1 protection set and A2-D2_2 of the A2 to D2 protection set into A1-D2_1, and similarly combining the other EC code chunks to get A1-D2_2, etc., a loss of any two of the six ZSCs, e.g., 410-460 can result in a data loss event. In an aspect, this can result from the loss of two data chunks and the corresponding combined EC code chunk. As an example, if ZSC 410 and ZSC 450 become less accessible, then A1, A2, and A1-D2_1 also become less accessible, resulting in B1, C1, D1, and A1-D2_2 being insufficient to recover A1 where A1-D2_2 comprises relevant data for A1-D1_2 but not A1-D1_1, and similarly also resulting in B2, C2, D2, and A1-D2_2 being insufficient to recover A2 where A1-D2_2 comprises relevant data for A2-D2_1 but not A2-D2_1. As such, the loss of ZSC 410 and 450 can result in a data loss event even where the 4+2 EC scheme is associated with resiliency against the loss of any two of the six zones. As such, system states 404 can be restricted, prohibited, etc., to reduce the likelihood of a data loss event, to maintain a level of data protection associated with a given EC scheme, etc.

Figure 5:
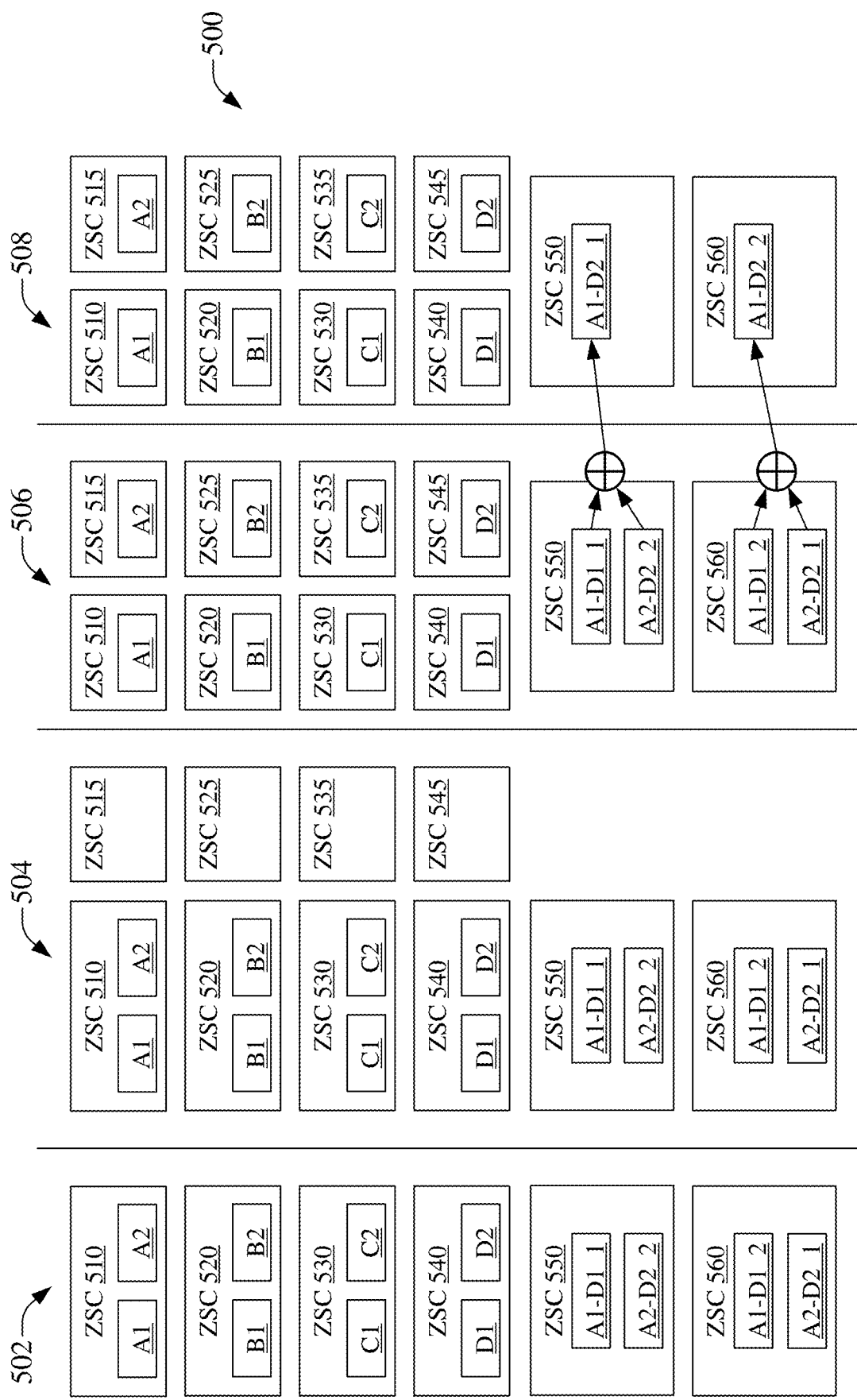
FIG. 5 is an illustration of an example system that can enable combining erasure coding code chunks in a geographically diverse storage system via updating an intermediate erasure coding protection scheme, in accordance with aspects of the subject disclosure.

FIG. 5 is an illustration of a system 500, which can facilitate combining erasure coding code chunks in a geographically diverse storage system via updating an intermediate erasure coding protection scheme, in accordance with aspects of the subject disclosure. System 500 can illustrate, at system state 502, a six zone GEO, e.g., comprising ZSCs 510 to 560. The zones can store data, e.g., chunks, e.g., data chunks A1 to D2, EC code chunks A1-D1_1 to A2-D2_2, etc. System 500, at state 502, can be the same as, or similar to, system 400 at state 402.

As is disclosed in regard to system 400, some distributions of protection set chunks in a GEO can result in a prohibition against combining EC code chunks. However, in some circumstances, for example, in response to a scaling-out event, the redistribution of protection set chunks can support altering, updating, replacing, etc., an EC scheme to allow combining of EC code chunks in a manner that is germane to the newly employed EC scheme. Moreover, this type of combining of EC code chunks can be performed without the usual demand on computing resources typically associated with re-encoding according to a new EC scheme because, where it is already generally desirable to redistribute chunks in response to a scale-out event, the resulting distribution can support combining the EC code chunks in a complementary manner that can be much less computer resource intensive that copying data chunks to a zone, re-encoding, and then distributing the resulting protection set.

At this point it is valuable to understand that a 'final' EC scheme can be determined, designated, etc., prior to employing an 'initial' EC scheme; prior to adapting an EC scheme to an 'intermediate' EC scheme; prior to adapting an EC scheme to the final EC scheme; etc. A final EC scheme can be determined, designated, etc., based on a designated, determined, etc., final storage overhead; based on a designated, determined, etc., final count of zones for a GEO; etc. As an example, a final GEO topology can be designated as having at least 18 zones, and a final EC scheme can be determined to be 16+2. In an aspect, for this example, even where the GEO is expanded beyond 18 zones, the final EC scheme of 16+2 can still be employed. In this example, the storage overhead would be $2/16$ of a chunk size. Further, in this example, a final coding matrix (CM), CM-final, can be designated as a 2×16 matrix.

It will then be appreciated that a 16+2 EC scheme typically cannot be effected in less than 18 zones. Where 18 zones can be undesirable as a starting point for the GEO, an initial GEO deployment can be selected, designated, determined, etc., for example a six zone GEO that can support, for example, a 4+2 EC scheme. In an aspect the 4+2 EC scheme can be designated as an initial EC scheme in contrast to the example final 16+2 EC scheme. Accordingly, an initial coding matrix, CM-initial, can be determined, designated, etc., as a 2×4 matrix. In an aspect, a submatrix of a CM-final, e.g., CM-initial, CM-interim-1, CM-interim-2, etc., can be combined with a complementary submatrix to generate a further submatrix up to the further submatrix being CM-final. As an example, two complementary initial 2×4 coding matrixes, representing two corresponding 4+2 EC protection sets, can be combined to yield a first 2×8 intermediate coding matrix representing an 8+2 EC protection set that can protect the data chunks originally protected by the above two 4+2 EC protection sets. Similarly, by example, the first 2×8 intermediate coding matrix can be combined with a second 2×8 coding intermediate matrix or, as an aside, two 2×4 initial coding matrixes, to yield a 2×16 final CM that can protect a 16+2 EC protection set comprising data corresponding to the data protected by EC protection sets associated with the first and second intermediate coding matrixes or, for the above aside, corresponding to the data protected by EC protection sets associated with the first intermediate coding matrix and the two initial coding matrixes. It is noted that more, or fewer, than one intermediate coding matrix tier can be employed. As an example, four 2×4 initial coding matrixes can be combined into one 2×16 final coding matrix in response to a sufficiently large scale-out of the GEO, e.g., from less than 18 zones to 18 zones or more. In this example, the GEO, for example, can have four 4+2 protection sets stored across six zones, and the GEO can be expanded to 18 zones, whereby the redistribution of the data chunks of the four 4+2 protection sets can be accomplished and the corresponding EC coding chunks can be combined and distributed into the remaining two zones of the now 18 zone GEO. It is further noted that for a k+m protection scheme, an m×k coding matrix can be used to produce m coding fragments/chunks out of the k data fragments/chunks. A submatrix m×l of the matrix m×k (l<k) is a proper coding matrix for a protection scheme l+m as is presented in more detail elsewhere herein.

Returning to the illustrations of system 500, at system state 504, system 500 can undergo a scale-out event that can, for example, add four ZSCs, e.g. ZSC 515 to 545, to the GEO. In response to this scale-out event, as disclosed herein, it can be desirable to redistribute stored chunks, for example, to increase the availability of stored data, e.g., broader distribution allows more data to remain available after a zone becomes compromised.

At system state 506, system 500 is illustrated after redistribution of the protected chunks, e.g., chunks A2-D2 can be moved from ZSCs 510-540 to ZSC 515-545, etc. In this state, system 500 can be viewed as comprising two protection sets, each employing a 4+2 EC scheme. Accordingly, the storage overhead is 50% for each 4+2 EC protection set. It can be desirable to reduce the storage overhead, for example to 25% by combining EC coding chunks as part of adapting the EC scheme from a 4+2 EC scheme to an 8+2 EC scheme. It is noted that, unlike the example illustrated in system 400, combining complementary EC matrixes corresponding to the two 4+2 EC protection sets does not increase the risk of a data loss event because the redistribution of the protected data chunks has increase diversity sufficiently that the loss of any two zones is tolerable without loss of access to stored data.

At state 508, A1-D1_1 of the A1 to D1 protection set and A2-D2_2 of the A2 to D2 protection set, for example, can be combined into A1-D2_1 at ZSC 550, and similarly A1-D1_2 of the A1 to D1 protection set and A2-D2_1 of the A2 to D2 protection set, for example, can be combined into A1-D2_2 at ZSC 560. In these examples, A1-D1_1 and A2-D2_1 can each correspond to complementary 2×4 coding matrixes; A1-D1_2 and A2-D2_1 can also each correspond to complementary 2×4 coding matrixes; and A1-D2_1 and A1-D2_2 can each correspond to 2×8 coding matrixes.

Based on the example topology of system 500 at system state 508, the now 10 zones can be resilient to a loss of any two of those zones. As an example, loss of ZSC 510 can result in chunk A1 becoming less accessible and loss of ZSC 560 can result in EC coding chunk A1-D2_2 becoming less accessible. Accordingly, chunk A1 can be recovered via B1, C1, D1, and A1-D2_1. As such, unlike in system 400, the redistribution of data chunks is germane to the combining of EC coding chunks according to an updated EC scheme such that the protection associated with the EC coding scheme is maintained.

FIG. 6 is an illustration of example coding matrixes 600-604 that can be employed by a system to facilitate combining erasure coding code chunks in a geographically diverse storage system that can update an erasure coding scheme, in accordance with aspects of the subject disclosure.

The system can comprise components that can be the same as, or similar to, systems 100-500. Accordingly, the system can employ the illustrated example matrixes to facilitate combining of complementary coding matrixes corresponding to protection sets in accord with a GEO undergoing a scale-out event, for example, as illustrated for system 500, etc.

Matrix 600 can be a 2×8 coding matrix corresponding to an 8+2 EC protection set, for example, as illustrated at system state 508 for system 500. As an example, matrix 600 can correspond to A1-D2_1 at ZSC 550 in system state 508, A1-D2_2 at ZSC 560 in system state 508, etc., for system 500. Matrix 602 and 604 can be a 2×4 coding matrixes corresponding to an 4+2 EC protection sets, for example, as illustrated at system state 502-506 for system 500. As examples, matrix 602 can correspond to A1-D1_1 and/or A2-D2_2 at ZSC 550 in system states 502-506; A1-D1_2 and/or A2-D2_1 at ZSC 560 in system states 502-506; etc., for system 500. In an aspect, the three coding matrices, e.g., 600-604 corresponding to the protection schemes 8+2, 4+2, and again 4+2, can share values of coefficients $X_{i,j}$ with the same i and j.

In an aspect, coding matrix 602 and 604 can have the same size and they can complement each other, e.g., combining matrixes does not destroy values of other contributing matrixes. As such, uniting coding matrix 602 and 604 can form the coding matrix 600. In an aspect, this complementary matrix effect can be employed, for example, in combining A1-D1_1 and A2-D2_2 to yield A1-D2_1 and, similarly, combining A1-D1_2 and A2-D2_1 to yield A1-D2_2 from system state 506 to system state 508 for system 500. It is noted that 'normalized' indices can be used in complementary coding matrixes, e.g., due to 'normalizing' the indices, X(1,1) of CM 602 appears to be in the same matrix position as X(1,5) of CM 604, that is CM 604 can be index shifted when combined with another CM based on an offset derived from the other CM, e.g., CM 604 can be offset by four columns. In some embodiments, the CMs can be zero padded to achieve the same result, e.g., CM 604 can be zero padded by four columns, not illustrated. In further embodiments, other matrix and/or data techniques can be employed to cause the CMs to be complementary for combining. As a further example, a third 2×4 CM, not illustrated, can be offset, zero padded, etc., by eight columns, causing the third 2×4 CM to be complementary to the CM 602 and CM 604, enabling the three CMs to be combined into a 2×12 CM not illustrated.

In developing a GEO storage system, a protection scheme can be chosen that can keep in mind a potential system expansion in future. As an example, a 16+2 protection scheme can be chosen as a future final EC scheme for the GEO setup. Accordingly, 16+2 can be a final protection scheme for the system, where $k_{final}$ is 16 and m is 2. Moreover, an initial protection scheme can be selected according to an initial number of zones to deploy in the new GEO system, e.g., $N_1$. Where m=2 and $N_1$=6 in this example, $k_{initial}$ can be determined, e.g., $k_{initial}=N_1-m=4$ in this example, to assure data recovery after m zone failures. For this example, the protection scheme $k_{initial}+m=6$ can be used for all new data for the GEO system before a scaling-out event. Accordingly, multiple coding matrices $m \times k_{initial}$ can be used for to generate EC coding chunks stored in the GEO before a scaling-out event. These example coding matrixes can be complementary to enable updating the EC scheme where a scaling-out of the GEO occurs at a future time, e.g., as submatrices of the final coding matrix m×$k_{final}$ corresponding to the potential final protection scheme $k_{final}$+m.

In response to a scaling-out of the example GEO, for example, four more zones get added to the system, an updated protection scheme can be selected, as is disclosed elsewhere herein. As an example, the updated EC scheme can be based on the now 10 total GEO zones, e.g., $N_2$=10. Accordingly, an intermediate $k_2$ can be calculated, e.g., $k_2$=$N_2$−m=8 in this example, to again assure data recovery after m zone failures. This can provide higher capacity use efficiency, e.g., a lower storage overhead. At the moment the GEO system switches to the new EC scheme, all previously existing protection sets can be regarded as degraded protection sets because the number of data chunks they unite can be fewer than $k_2$, e.g., in this example, $k_2$=8 and $k_{initial}$=4, and 4<8. Complementary protection sets can be consolidated. In an embodiment, protection sets that can have their coding chunks stored to the same zones can be consolidated before other protection sets. This process can be iterated until the next k reaches the value of $k_{final}$. As a benefit to this technology, the computing resources to re-encode can be conserved because the existing complementary CMs, and therefore their corresponding EC coding chunks, can simply be combined where the GEO is scaled-out, until $k_{final}$ is reached. In an aspect, where it is generally desirable to redistribute chunks in response to a scaling-out event in a GEO, comparatively very few additional computing resources need to be consumed to reduce the storage overhead according to an updated EC scheme where complementary CMs can be combined rather than re-encoding all the data protection sets according to the updated EC scheme.

Figure 7:
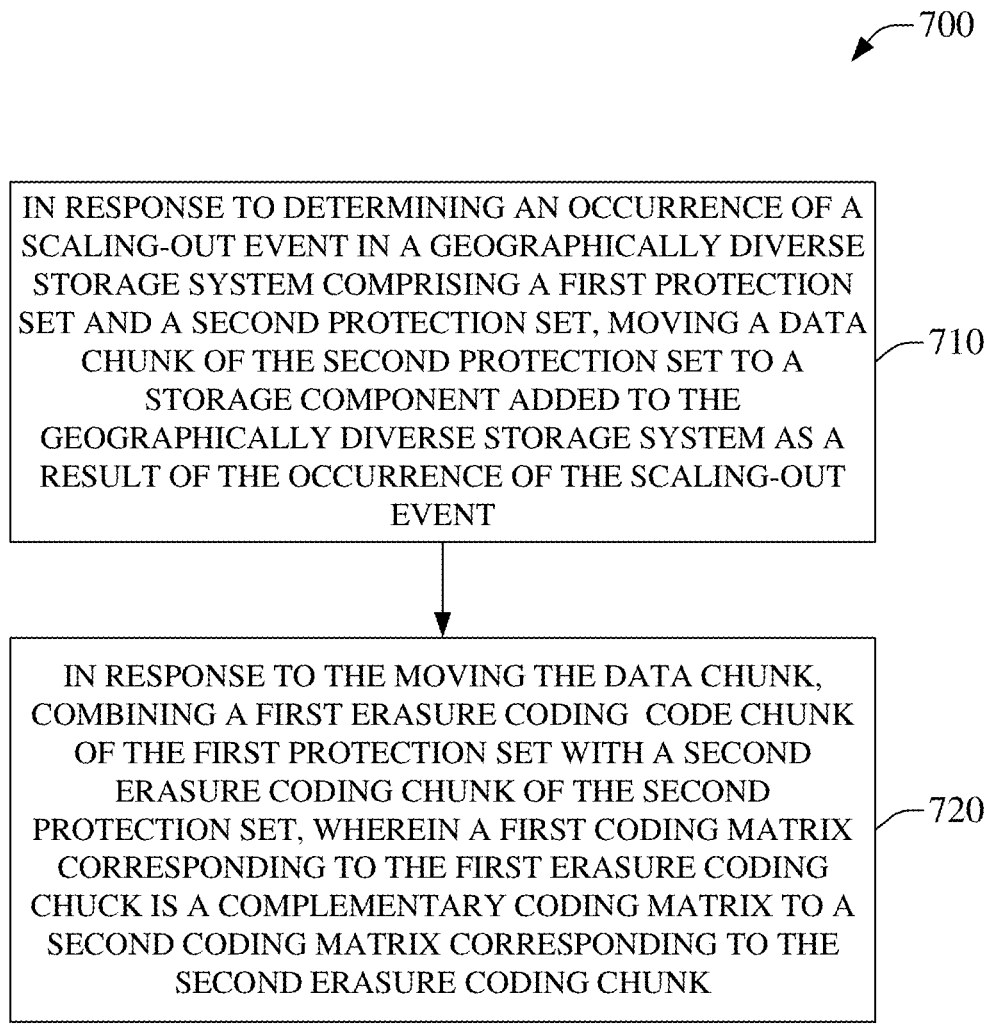
FIG. 7 is an illustration of an example method facilitating erasure coding for data chunks in a geographically diverse storage system, in accordance with aspects of the subject disclosure.
Figure 8:
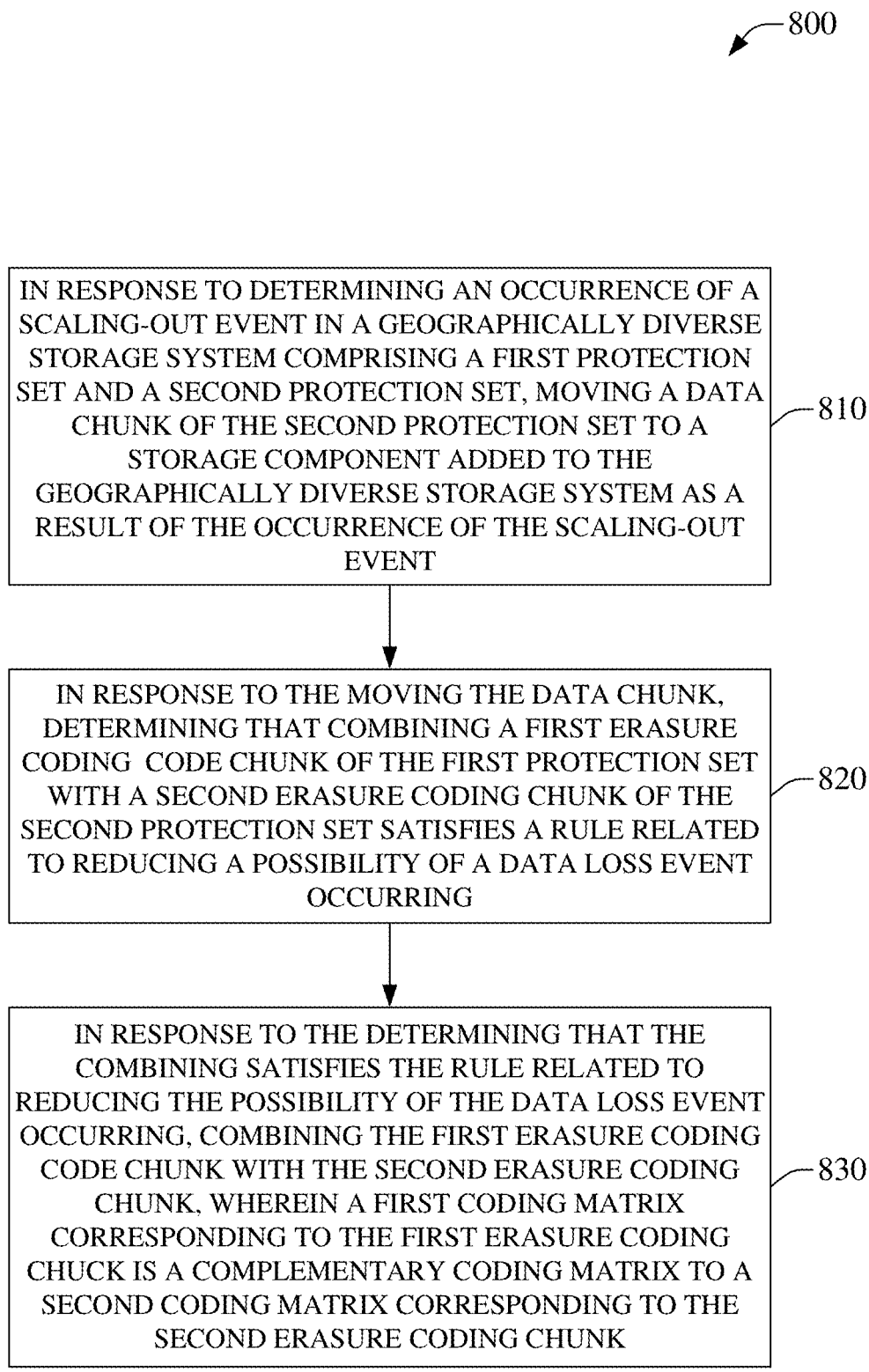
FIG. 8 illustrates an example method that enables combining erasure coding code chunks in a geographically diverse storage system based on the topology of the geographically diverse data storage system being determined to satisfy a rule related to reducing a likelihood of a data loss event, in accordance with aspects of the subject disclosure.

In view of the example system(s) described above, example method(s) that can be implemented in accordance with the disclosed subject matter can be better appreciated with reference to flowcharts in FIG. 7-FIG. 8. For purposes of simplicity of explanation, example methods disclosed herein are presented and described as a series of acts; however, it is to be understood and appreciated that the claimed subject matter is not limited by the order of acts, as some acts may occur in different orders and/or concurrently with other acts from that shown and described herein. For example, one or more example methods disclosed herein could alternatively be represented as a series of interrelated states or events, such as in a state diagram. Moreover, interaction diagram(s) may represent methods in accordance with the disclosed subject matter when disparate entities enact disparate portions of the methods. Furthermore, not all illustrated acts may be required to implement a described example method in accordance with the subject specification. Further yet, two or more of the disclosed example methods can be implemented in combination with each other, to accomplish one or more aspects herein described. It should be further appreciated that the example methods disclosed throughout the subject specification are capable of being stored on an article of manufacture (e.g., a computer-readable medium) to allow transporting and transferring such methods to computers for execution, and thus implementation, by a processor or for storage in a memory.

FIG. 7 is an illustration of an example method 700, facilitating erasure coding for data chunks in a geographically diverse storage system, in accordance with aspects of the subject disclosure. At 710, method 700 can comprise determining moving a data chunk of a second protection set to a storage component added to a GEO as a result of a scaling-out event. The moving can be in response to determining an occurrence of the scaling of the GEO. The GEO can comprise a first and second data protection set.

In an aspect, a GEO can comprise a plurality of data protection sets, wherein each data protection set can comprise k data chunk(s) and m erasure coding code chunk(s). Moreover, the data protection sets can be generated based on one or more EC schemes. As an example, a GEO can comprise a first and a second protection set each comprising four data chunks and two EC code chunks based on the first and second protections sets employing a (k+m) EC scheme, e.g., a 4+2 EC scheme. In an embodiment, the GEO can comprise at least k+m geographically diverse zones, e.g., 4+2=6 zones, that each can comprise a zone storage component that can each comprise a storage device that can store a chunk from a protection set, see for example, system 200, e.g., at system state 206; system 300, e.g., at system state 302, 204, 306; system 500, e.g., at system state 502, 504, 506; etc. In an aspect, the GEO can comprise more than k+m zones.

In an embodiment, chunks of the data protection set can be distributed across the GEO, e.g., in a 6 zone GEO employing 4+2 EC scheme, each zone can comprise one of the six chunks of each data protection set, wherein each data protection set can comprise four data chunks and two EC code chunks according to the 4+2 EC scheme. In an aspect, the GEO can support the use of more than one EC scheme as is noted elsewhere herein.

In an aspect, scaling-out of the GEO can result in adding additional zones to the GEO. As examples, scaling out of a six zone GEO can result in a seven zone GEO, a 10 zone GEO, a 13 zone GEO, etc. It can be desirable to redistribute stored chunks as a GEO is scaled-out. Redistribution of chunks can store the chunks in a more distributed manner, such that, for example, stored data can have a higher availability, e.g., more data can be accessible under conditions where some zones are less accessible when chunks are stored in a more distributed manner, as is disclosed elsewhere herein. In an aspect, more distributed storage can also increase recovery of compromised chunks based on more zones participating in the recovery of the compromised chunk(s). In an aspect, a k+m EC scheme can support access to data of the k chunks up to a loss of m of the k+m chunks of determined protection set. As an example, a 4+2 EC scheme can generate a 4+2 protection set that can store the six chunks on six zones of a GEO. In this example, loss of any two of the six chunks can be recovered from based on the remaining four chunks, e.g., loss of any two zones can be recovered from based on the remaining protection set chunks stored on the remaining four zones.

At 720, method 700 can comprise combining a first erasure coding code chunk with a second erasure coding code chunk in response to the moving at 710. At this point method 700 can end. In an aspect, the first EC code chunk can be comprised in the first protection set and the second EC code chunk can be comprised in the second protection set. Further, the first EC code chunk can correspond to a first coding matrix and the second EC code chunk can correspond to a second coding matrix. The first coding matrix can be complementary to the second coding matrix. Being complementary can enable combining the first and second coding matrixes, corresponding to combining the first and second EC code chunks, without perturbing the matrix values of the first and second coding matrix, which can correspond to not perturbing the data of the first and second coding matrixes during the combining of the first and second coding matrixes. A resulting combined EC code chunk can therefore be employed in recovering data chunks previously comprised in the first and second protection sets. It is noted that the data chunks previously comprised in the first and second protection sets can be protected under a new protection set corresponding to the combined EC code chunk in lieu of remaining protected under the first and second protection sets, e.g., the combining of corresponding EC code chunks results in both creating a new protection set according to a new EC scheme and also destroying the previous protection sets generated under the old EC scheme(s). As an example, two 4+2 EC scheme protection sets can become one 8+2 EC scheme protection set comprising a representation of the data chunks of the now defunct two 4+2 EC scheme protection sets.

FIG. 8 is an illustration of an example method 800, which can enable combining erasure coding code chunks in a geographically diverse storage system based on the topology of the geographically diverse data storage system being determined to satisfy a rule related to reducing a likelihood of a data loss event, in accordance with aspects of the subject disclosure. At 810, method 800 can comprise determining moving a data chunk of a second protection set to a storage component added to a GEO as a result of a scaling-out event. The moving can be in response to determining an occurrence of the scaling of the GEO. The GEO can comprise a first and second data protection set.

A GEO can comprise a plurality of data protection sets, wherein each data protection set can comprise k data chunk(s) and m erasure coding code chunk(s). The data protection sets can be generated based on one or more EC schemes. In an embodiment, the GEO can comprise at least k+m geographically diverse zones that each can comprise a zone storage component that can each comprise a storage device that can store a chunk from a protection set. In an aspect, the GEO can comprise more than k+m zones. Where the GEO comprises more than the k+m zones, it is possible that not all zones will comprise a chunk of each stored protection set.

In an embodiment, chunks of a data protection set can be distributed across a GEO, e.g., in a 6 zone GEO employing 4+2 EC scheme, each zone can comprise one of six chunks of each data protection set, wherein each data protection set can comprise four data chunks and two EC code chunks according to the 4+2 EC scheme. In an aspect, the GEO can support the use of more than one EC scheme as is noted elsewhere herein.

In an aspect, scaling-out of the GEO can result in adding additional zones to the GEO. It can be desirable to redistribute stored chunks as a GEO is scaled-out. Redistribution of chunks can store the chunks in a more distributed manner, such that, for example, stored data can have a higher availability, recovery of compromised chunks can be improved, etc. In an aspect, a k+m EC scheme can support access to data of the k chunks up to a loss of m of the k+m chunks of a determined protection set.

At 820, method 800 can comprise determining that combining a first EC code chunk and a second EC code chunk satisfies a rule. The rule can be related to reducing a possibility of a data loss event occurring. As an example, where scaling-out the 4+2 EC scheme GEO from a six zone to a seven zone GEO is associated with moving one data chunk to the new seventh zone, combining the EC code chunks can create a condition in which the loss of 2 of the now seven zones can result in some data chunks no longer being recoverable, e.g., increasing the possibility of a data loss event. Where the combining the EC code chunks can increase a possibility of a data loss event, more particularly above the threshold associated with a related EC scheme, the combining can be prevented, forbidden, restricted, etc. As a result, data can be more widely distributed in the scaled out system but updating the EC scheme corresponding to combining EC code chunks can be regulated, for example, based on determine that a rule related to reducing a possibility of a data loss event occurring is satisfied.

At 830, method 800 can comprise, in response to determining the rule at 820 is satisfied, combining the first EC code chunk with a second EC code chunk. At this point method 800 can end. In an aspect, the first EC code chunk can be comprised in the first protection set and the second EC code chunk can be comprised in the second protection set. Further, the first EC code chunk can correspond to a first coding matrix and the second EC code chunk can correspond to a second coding matrix. The first coding matrix can be complementary to the second coding matrix. Being complementary can enable combining the first and second coding matrixes, corresponding to combining the first and second EC code chunks, without perturbing the matrix values of the first and second coding matrix, which can correspond to not perturbing the data of the first and second coding matrixes during the combining of the first and second coding matrixes. A resulting combined EC code chunk can therefore be employed in recovering data chunks previously comprised in the first and second protection sets. In an aspect, this can be associated with the data chunks being protected according to a new, updated, adapted, altered, etc., EC scheme, e.g., data chunks previously comprised in the first and second protection sets can be protected under a new protection set corresponding to the combined EC code chunk according to a new EC scheme.

Figure 9:
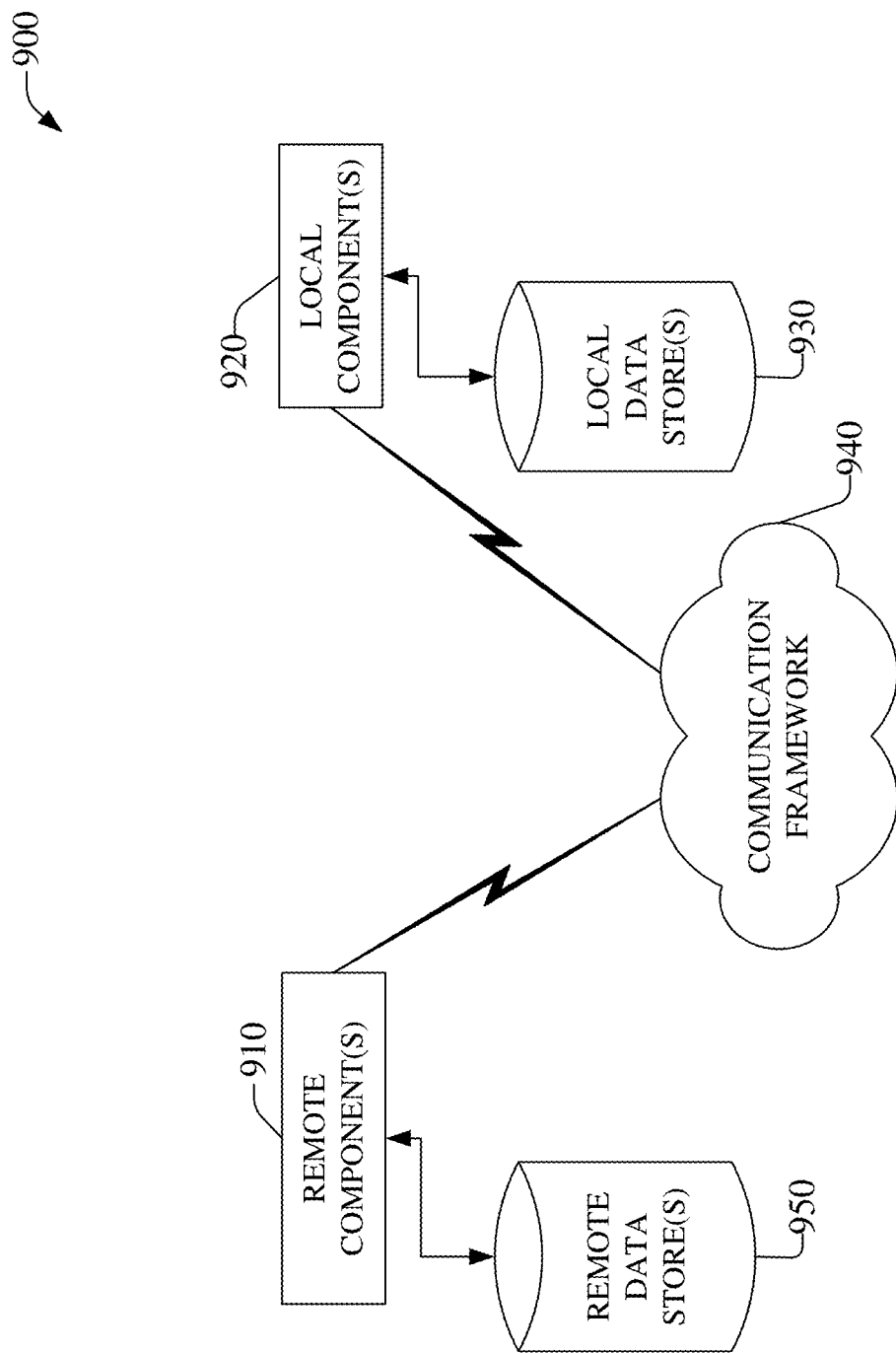
FIG. 9 depicts an example schematic block diagram of a computing environment with which the disclosed subject matter can interact.

FIG. 9 is a schematic block diagram of a computing environment 900 with which the disclosed subject matter can interact. The system 900 comprises one or more remote component(s) 910. The remote component(s) 910 can be hardware and/or software (e.g., threads, processes, computing devices). In some embodiments, remote component(s) 910 can be a remotely located ZSC connected to a local ZSC via communication framework, e.g., communication framework 102, 940, etc. Communication framework 940 can comprise wired network devices, wireless network devices, mobile devices, wearable devices, radio access network devices, gateway devices, femtocell devices, servers, etc. In an aspect the remotely located ZSC can be embodied in ZSC 110, 120, 130; Zones A-F of system 200; ZSCs of system 300, 400, 500, etc.; or in other component(s) of the disclosed subject matter.

The system 900 also comprises one or more local component(s) 920. The local component(s) 920 can be hardware and/or software (e.g., threads, processes, computing devices). In some embodiments, local component(s) 920 can comprise a local ZSC connected to a remote ZSC via communication framework 940. In an aspect the local ZSC can be embodied in ZSC 110, 120, 130; Zones A-F of system 200; ZSCs of system 300, 400, 500, etc.; or in other component(s) of the disclosed subject matter.

One possible communication between a remote component(s) 910 and a local component(s) 920 can be in the form of a data packet adapted to be transmitted between two or more computer processes. Another possible communication between a remote component(s) 910 and a local component(s) 920 can be in the form of circuit-switched data adapted to be transmitted between two or more computer processes in radio time slots. The system 900 comprises a communication framework 940 that can be employed to facilitate communications between the remote component(s) 910 and the local component(s) 920, and can comprise an air interface, e.g., Uu interface of a UMTS network, via a long-term evolution (LTE) network, etc. Remote component(s) 910 can be operably connected to one or more remote data store(s) 950, such as a hard drive, solid state drive, SIM card, device memory, etc., that can be employed to store information on the remote component(s) 910 side of communication framework 940. Similarly, local component(s) 920 can be operably connected to one or more local data store(s) 930, that can be employed to store information on the local component(s) 920 side of communication framework 940. As an example, information corresponding to chunks stored on ZSCs can be communicated via communication framework 940 to other ZSCs of a storage network, e.g., to facilitate recovering segments protected by a hierarchical erasure coding scheme, etc., as disclosed herein.

Figure 10:
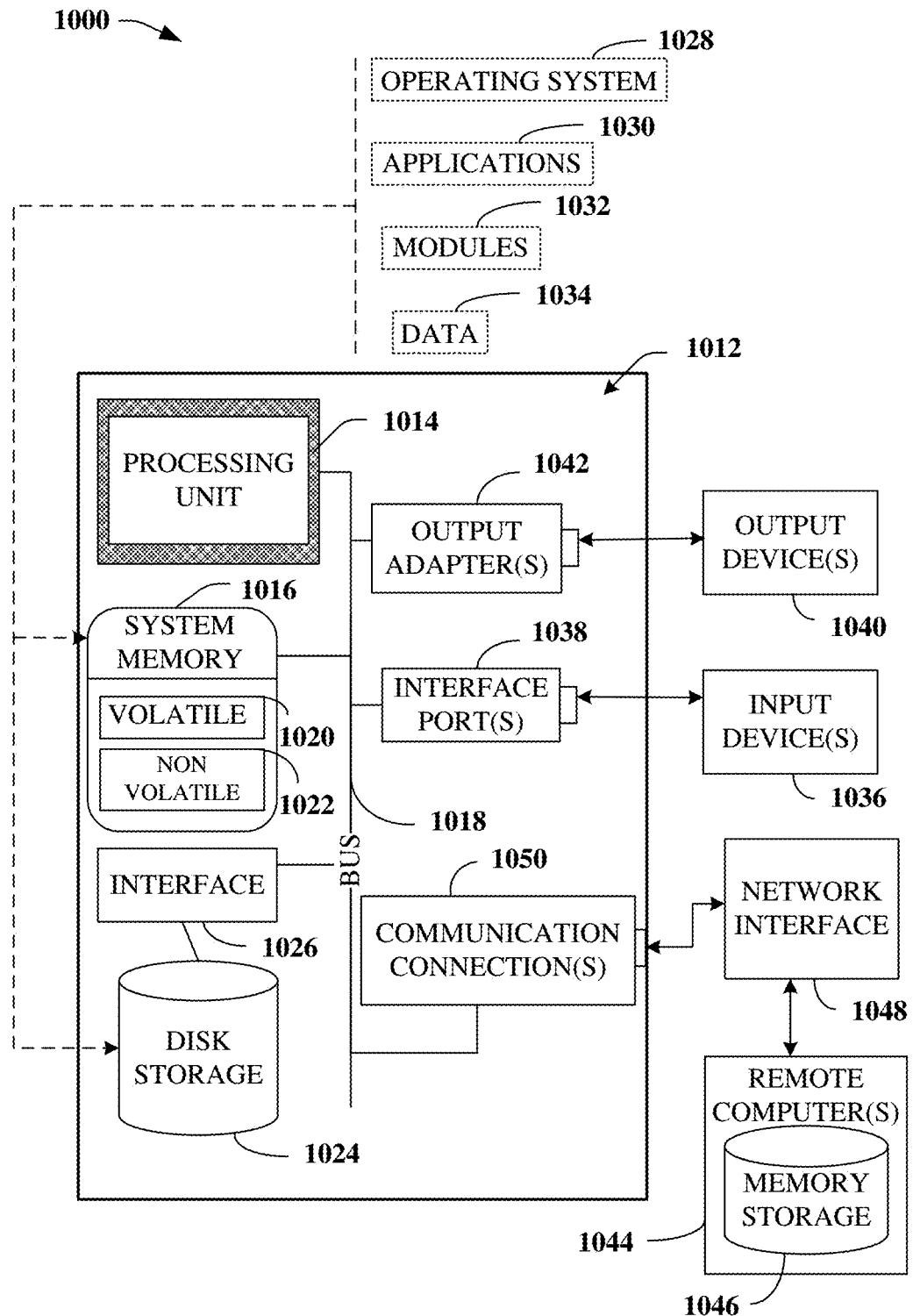
FIG. 10 illustrates an example block diagram of a computing system operable to execute the disclosed systems and methods in accordance with an embodiment.

In order to provide a context for the various aspects of the disclosed subject matter, FIG. 10, and the following discussion, are intended to provide a brief, general description of a suitable environment in which the various aspects of the disclosed subject matter can be implemented. While the subject matter has been described above in the general context of computer-executable instructions of a computer program that runs on a computer and/or computers, those skilled in the art will recognize that the disclosed subject matter also can be implemented in combination with other program modules. Generally, program modules comprise routines, programs, components, data structures, etc. that performs particular tasks and/or implement particular abstract data types.

In the subject specification, terms such as "store," "storage," "data store," data storage," "database," and substantially any other information storage component relevant to operation and functionality of a component, refer to "memory components," or entities embodied in a "memory" or components comprising the memory. It is noted that the memory components described herein can be either volatile memory or nonvolatile memory, or can comprise both volatile and nonvolatile memory, by way of illustration, and not limitation, volatile memory 1020 (see below), nonvolatile memory 1022 (see below), disk storage 1024 (see below), and memory storage 1046 (see below). Further, nonvolatile memory can be included in read only memory, programmable read only memory, electrically programmable read only memory, electrically erasable read only memory, or flash memory. Volatile memory can comprise random access memory, which acts as external cache memory. By way of illustration and not limitation, random access memory is available in many forms such as synchronous random access memory, dynamic random access memory, synchronous dynamic random access memory, double data rate synchronous dynamic random access memory, enhanced synchronous dynamic random access memory, SynchLink dynamic random access memory, and direct Rambus random access memory. Additionally, the disclosed memory components of systems or methods herein are intended to comprise, without being limited to comprising, these and any other suitable types of memory.

Moreover, it is noted that the disclosed subject matter can be practiced with other computer system configurations, comprising single-processor or multiprocessor computer systems, mini-computing devices, mainframe computers, as well as personal computers, hand-held computing devices (e.g., personal digital assistant, phone, watch, tablet computers, netbook computers, . . . ), microprocessor-based or programmable consumer or industrial electronics, and the like. The illustrated aspects can also be practiced in distributed computing environments where tasks are performed by remote processing devices that are linked through a communications network; however, some if not all aspects of the subject disclosure can be practiced on stand-alone computers. In a distributed computing environment, program modules can be located in both local and remote memory storage devices.

FIG. 10 illustrates a block diagram of a computing system 1000 operable to execute the disclosed systems and methods in accordance with an embodiment. Computer 1012, which can be, for example, comprised in a ZSC 110, 120, 130; Zones A-F of system 200; ZSCs of system 300, 400, 500, etc.; ECCC 108, 118,128,138, etc.; or in other components disclosed herein, can comprise a processing unit 1014, a system memory 1016, and a system bus 1018. System bus 1018 couples system components comprising, but not limited to, system memory 1016 to processing unit 1014. Processing unit 1014 can be any of various available processors. Dual microprocessors and other multiprocessor architectures also can be employed as processing unit 1014.

System bus 1018 can be any of several types of bus structure(s) comprising a memory bus or a memory controller, a peripheral bus or an external bus, and/or a local bus using any variety of available bus architectures comprising, but not limited to, industrial standard architecture, micro-channel architecture, extended industrial standard architecture, intelligent drive electronics, video electronics standards association local bus, peripheral component interconnect, card bus, universal serial bus, advanced graphics port, personal computer memory card international association bus, Firewire (Institute of Electrical and Electronics Engineers 1194), and small computer systems interface.

System memory 1016 can comprise volatile memory 1020 and nonvolatile memory 1022. A basic input/output system, containing routines to transfer information between elements within computer 1012, such as during start-up, can be stored in nonvolatile memory 1022. By way of illustration, and not limitation, nonvolatile memory 1022 can comprise read only memory, programmable read only memory, electrically programmable read only memory, electrically erasable read only memory, or flash memory. Volatile memory 1020 comprises read only memory, which acts as external cache memory. By way of illustration and not limitation, read only memory is available in many forms such as synchronous random access memory, dynamic read only memory, synchronous dynamic read only memory, double data rate synchronous dynamic read only memory, enhanced synchronous dynamic read only memory, Synch-Link dynamic read only memory, Rambus direct read only memory, direct Rambus dynamic read only memory, and Rambus dynamic read only memory.

Computer 1012 can also comprise removable/non-removable, volatile/non-volatile computer storage media. FIG. 10 illustrates, for example, disk storage 1024. Disk storage 1024 comprises, but is not limited to, devices like a magnetic disk drive, floppy disk drive, tape drive, flash memory card, or memory stick. In addition, disk storage 1024 can comprise storage media separately or in combination with other storage media comprising, but not limited to, an optical disk drive such as a compact disk read only memory device, compact disk recordable drive, compact disk rewritable drive or a digital versatile disk read only memory. To facilitate connection of the disk storage devices 1024 to system bus 1018, a removable or non-removable interface is typically used, such as interface 1026.

Computing devices typically comprise a variety of media, which can comprise computer-readable storage media or communications media, which two terms are used herein differently from one another as follows.

Computer-readable storage media can be any available storage media that can be accessed by the computer and comprises both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can comprise, but are not limited to, read only memory, programmable read only memory, electrically programmable read only memory, electrically erasable read only memory, flash memory or other memory technology, compact disk read only memory, digital versatile disk or other optical disk storage, magnetic cassettes, magnetic tape, magnetic disk storage or other magnetic storage devices, or other tangible media which can be used to store desired information. In this regard, the term "tangible" herein as may be applied to storage, memory or computer-readable media, is to be understood to exclude only propagating intangible signals per se as a modifier and does not relinquish coverage of all standard storage, memory or computer-readable media that are not only propagating intangible signals per se. In an aspect, tangible media can comprise non-transitory media wherein the term "non-transitory" herein as may be applied to storage, memory or computer-readable media, is to be understood to exclude only propagating transitory signals per se as a modifier and does not relinquish coverage of all standard storage, memory or computer-readable media that are not only propagating transitory signals per se. Computer-readable storage media can be accessed by one or more local or remote computing devices, e.g., via access requests, queries or other data retrieval protocols, for a variety of operations with respect to the information stored by the medium. The term machine-readable storage medium can be treated as similar to computer-readable storage media, e.g., whereas a machine comprises a computer, machine-readable storage media can be read by the computer comprised in the machine. As such, for example, a computer-readable medium can comprise executable instructions stored thereon that, in response to execution, can cause a system comprising a processor to perform operations, comprising determining that a geographically diverse data storage system has undergone a scaling-out event from a first count of storage zones to a second count of storage zones, transferring a first chunk to a second storage zone, and based on a probability of a data loss event occurring based on a predicted result of combining the first erasure coding code chunk and a second erasure coding code chunk, merging a first erasure coding code chunk and a second erasure coding code chunk having complementary coding matrixes.

Communications media typically embody computer-readable instructions, data structures, program modules or other structured or unstructured data in a data signal such as a modulated data signal, e.g., a carrier wave or other transport mechanism, and comprises any information delivery or transport media. The term "modulated data signal" or signals refers to a signal that has one or more of its characteristics set or changed in such a manner as to encode information in one or more signals. By way of example, and not limitation, communication media comprise wired media, such as a wired network or direct-wired connection, and wireless media such as acoustic, RF, infrared and other wireless media.

It can be noted that FIG. 10 describes software that acts as an intermediary between users and computer resources described in suitable operating environment 1000. Such software comprises an operating system 1028. Operating system 1028, which can be stored on disk storage 1024, acts to control and allocate resources of computer system 1012. System applications 1030 take advantage of the management of resources by operating system 1028 through program modules 1032 and program data 1034 stored either in system memory 1016 or on disk storage 1024. It is to be noted that the disclosed subject matter can be implemented with various operating systems or combinations of operating systems.

A user can enter commands or information into computer 1012 through input device(s) 1036. In some embodiments, a user interface can allow entry of user preference information, etc., and can be embodied in a touch sensitive display panel, a mouse/pointer input to a graphical user interface (GUI), a command line controlled interface, etc., allowing a user to interact with computer 1012. Input devices 1036 comprise, but are not limited to, a pointing device such as a mouse, trackball, stylus, touch pad, keyboard, microphone, joystick, game pad, satellite dish, scanner, TV tuner card, digital camera, digital video camera, web camera, cell phone, smartphone, tablet computer, etc. These and other input devices connect to processing unit 1014 through system bus 1018 by way of interface port(s) 1038. Interface port(s) 1038 comprise, for example, a serial port, a parallel port, a game port, a universal serial bus, an infrared port, a Bluetooth port, an IP port, or a logical port associated with a wireless service, etc. Output device(s) 1040 use some of the same type of ports as input device(s) 1036.

Thus, for example, a universal serial busport can be used to provide input to computer 1012 and to output information from computer 1012 to an output device 1040. Output adapter 1042 is provided to illustrate that there are some output devices 1040 like monitors, speakers, and printers, among other output devices 1040, which use special adapters. Output adapters 1042 comprise, by way of illustration and not limitation, video and sound cards that provide means of connection between output device 1040 and system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. Remote computer(s) 1044 can be a personal computer, a server, a router, a network PC, cloud storage, a cloud service, code executing in a cloud-computing environment, a workstation, a microprocessor-based appliance, a peer device, or other common network node and the like, and typically comprises many or all of the elements described relative to computer 1012. A cloud computing environment, the cloud, or other similar terms can refer to computing that can share processing resources and data to one or more computer and/or other device(s) on an as needed basis to enable access to a shared pool of configurable computing resources that can be provisioned and released readily. Cloud computing and storage solutions can store and/or process data in third-party data centers which can leverage an economy of scale and can view accessing computing resources via a cloud service in a manner similar to a subscribing to an electric utility to access electrical energy, a telephone utility to access telephonic services, etc.

For purposes of brevity, only a memory storage device 1046 is illustrated with remote computer(s) 1044. Remote computer(s) 1044 is logically connected to computer 1012 through a network interface 1048 and then physically connected by way of communication connection 1050. Network interface 1048 encompasses wire and/or wireless communication networks such as local area networks and wide area networks. Local area network technologies comprise fiber distributed data interface, copper distributed data interface, Ethernet, Token Ring and the like. Wide area network technologies comprise, but are not limited to, point-to-point links, circuit-switching networks like integrated services digital networks and variations thereon, packet switching networks, and digital subscriber lines. As noted below, wireless technologies may be used in addition to or in place of the foregoing.

Communication connection(s) 1050 refer(s) to hardware/software employed to connect network interface 1048 to bus 1018. While communication connection 1050 is shown for illustrative clarity inside computer 1012, it can also be external to computer 1012. The hardware/software for connection to network interface 1048 can comprise, for example, internal and external technologies such as modems, comprising regular telephone grade modems, cable modems and digital subscriber line modems, integrated services digital network adapters, and Ethernet cards.

The above description of illustrated embodiments of the subject disclosure, comprising what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit, a digital signal processor, a field programmable gate array, a programmable logic controller, a complex programmable logic device, a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor may also be implemented as a combination of computing processing units.

As used in this application, the terms "component," "system," "platform," "layer," "selector," "interface," and the like are intended to refer to a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, a program, and/or a computer. By way of illustration and not limitation, both an application running on a server and the server can be a component. One or more components may reside within a process and/or thread of execution and a component may be localized on one computer and/or distributed between two or more computers. In addition, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or a firmware application executed by a processor, wherein the processor can be internal or external to the apparatus and executes at least a part of the software or firmware application. As yet another example, a component can be an apparatus that provides specific functionality through electronic components without mechanical parts, the electronic components can comprise a processor therein to execute software or firmware that confers at least in part the functionality of the electronic components.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. Moreover, the use of any particular embodiment or example in the present disclosure should not be treated as exclusive of any other particular embodiment or example, unless expressly indicated as such, e.g., a first embodiment that has aspect A and a second embodiment that has aspect B does not preclude a third embodiment that has aspect A and aspect B. The use of granular examples and embodiments is intended to simplify understanding of certain features, aspects, etc., of the disclosed subject matter and is not intended to limit the disclosure to said granular instances of the disclosed subject matter or to illustrate that combinations of embodiments of the disclosed subject matter were not contemplated at the time of actual or constructive reduction to practice.

Further, the term "include" is intended to be employed as an open or inclusive term, rather than a closed or exclusive term. The term "include" can be substituted with the term "comprising" and is to be treated with similar scope, unless otherwise explicitly used otherwise. As an example, "a basket of fruit including an apple" is to be treated with the same breadth of scope as, "a basket of fruit comprising an apple."

Furthermore, the terms "user," "subscriber," "customer," "consumer," "prosumer," "agent," and the like are employed interchangeably throughout the subject specification, unless context warrants particular distinction(s) among the terms. It should be appreciated that such terms can refer to human entities, machine learning components, or automated components (e.g., supported through artificial intelligence, as through a capacity to make inferences based on complex mathematical formalisms), that can provide simulated vision, sound recognition and so forth.

Aspects, features, or advantages of the subject matter can be exploited in substantially any, or any, wired, broadcast, wireless telecommunication, radio technology or network, or combinations thereof. Non-limiting examples of such technologies or networks comprise broadcast technologies (e.g., sub-Hertz, extremely low frequency, very low frequency, low frequency, medium frequency, high frequency, very high frequency, ultra-high frequency, super-high frequency, extremely high frequency, terahertz broadcasts, etc.); Ethernet; X.25; powerline-type networking, e.g., Powerline audio video Ethernet, etc.; femtocell technology; Wi-Fi; worldwide interoperability for microwave access; enhanced general packet radio service; second generation partnership project (2G or 2GPP); third generation partnership project (3G or 3GPP); fourth generation partnership project (4G or 4GPP); long term evolution (LTE); fifth generation partnership project (5G or 5GPP); third generation partnership project universal mobile telecommunications system; third generation partnership project 2; ultra mobile broadband; high speed packet access; high speed downlink packet access; high speed uplink packet access; enhanced data rates for global system for mobile communication evolution radio access network; universal mobile telecommunications system terrestrial radio access network; or long term evolution advanced. As an example, a millimeter wave broadcast technology can employ electromagnetic waves in the frequency spectrum from about 30 GHz to about 300 GHz. These millimeter waves can be generally situated between microwaves (from about 1 GHz to about 30 GHz) and infrared (IR) waves, and are sometimes referred to extremely high frequency (EHF). The wavelength ($\lambda$) for millimeter waves is typically in the 1-mm to 10-mm range.

The term "infer" or "inference" can generally refer to the process of reasoning about, or inferring states of, the system, environment, user, and/or intent from a set of observations as captured via events and/or data. Captured data and events can include user data, device data, environment data, data from sensors, sensor data, application data, implicit data, explicit data, etc. Inference, for example, can be employed to identify a specific context or action, or can generate a probability distribution over states of interest based on a consideration of data and events. Inference can also refer to techniques employed for composing higher-level events from a set of events and/or data. Such inference results in the construction of new events or actions from a set of observed events and/or stored event data, whether the events, in some instances, can be correlated in close temporal proximity, and whether the events and data come from one or several event and data sources. Various classification schemes and/or systems (e.g., support vector machines, neural networks, expert systems, Bayesian belief networks, fuzzy logic, and data fusion engines) can be employed in connection with performing automatic and/or inferred action in connection with the disclosed subject matter.

What has been described above includes examples of systems and methods illustrative of the disclosed subject matter. It is, of course, not possible to describe every combination of components or methods herein. One of ordinary skill in the art may recognize that many further combinations and permutations of the claimed subject matter are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

What is claimed is:

1. A system, comprising:
   a processor; and
   a memory that stores executable instructions that, when executed by the processor, facilitate performance of operations, comprising:
   in response to determining that a geographically diverse data storage system has scaled-out from a first count of storage zones to a second count of storage zones by adding at least one additional storage zone, moving a first chunk from a first storage zone of the first count of storage zones to a second storage zone of the at least one additional storage zone, wherein the first chunk is comprised in a first data protection set of data protection sets stored by the geographically diverse data storage system, wherein the first data protection set employs a first erasure coding scheme, and wherein the first data protection set comprises a first erasure coding code chunk according to the first erasure coding scheme;
   in response to the moving the first chunk, determining a second erasure coding code chunk of a second protection set of the data protection sets, wherein the first erasure coding chunk corresponds to a first coding matrix, wherein the second erasure coding code chunk corresponds to a second coding matrix, and wherein the first coding matrix is complementary to the second coding matrix; and
   in response to the determining the second erasure coding chunk, generating a third coding matrix for a third erasure coding code chunk based on uniting the first erasure coding code chunk and the second erasure coding code chunk, wherein the third erasure coding code chunk is comprised in a third data protection set that protects the first chunk.

2. The system of claim 1, wherein the merging the first erasure coding code chunk and the second erasure coding code chunk is allowed in response to determining that a predicted result of the uniting satisfies a rule related to a probability of a data loss event.

3. The system of claim 1, wherein the moving the first chunk results in increasing a storage diversity of the geographically diverse data storage system.

4. The system of claim 3, wherein the increasing the storage diversity of the geographically diverse data storage system improves accessibility of data stored by the geographically diverse data storage system when a portion of the geographically diverse data storage system has become less accessible.

5. The system of claim 3, wherein the increasing the storage diversity of the geographically diverse data storage system improves recovery of data stored by the geographically diverse data storage system by enabling more storage zones than would be available before the increasing the storage diversity to participate in recovery of a portion of the data when a portion of the geographically diverse data storage system has become less accessible.

6. The system of claim 1, wherein the first count of storage zones is at least k+m storage zones, wherein k is a first count of data chunks stored in the first data protection set according to the first erasure coding scheme, and wherein m is a second count of erasure coding code chunks stored in the first data protection set according to the first erasure coding scheme.

7. The system of claim 1, wherein the second count of storage zones is at least 2k+m storage zones, wherein k is a first count of data chunks stored in the first data protection set according to the first erasure coding scheme, and wherein m is a second count of erasure coding code chunks stored in the first data protection set according to the first erasure coding scheme.

8. The system of claim 1, wherein the second data protection set employs the first erasure coding scheme.

9. The system of claim 1, wherein the second data protection set employs a second erasure coding scheme that is a different erasure coding scheme than the first erasure coding scheme.

10. The system of claim 1, wherein the uniting the first erasure coding code chunk and the second erasure coding code chunk comprises shifting an index of the first coding matrix such that the first coding matrix is complementary to the second coding matrix.

11. The system of claim 1, wherein the first coding matrix is complementary to the second coding matrix dues to zero padding the first coding matrix relative to the second coding matrix.

12. The system of claim 1, wherein the third data protection set has a lower storage overhead than the first data protection set.

13. The system of claim 1, wherein the processor is comprised in an erasure coding control component comprised at least in part in one of the first count of storage zones of the geographically diverse data storage system.

14. The system of claim 1, wherein the processor is comprised in an erasure coding control component communicatively coupled to the geographically diverse data storage system.

15. A method, comprising:
  determining, by a system comprising a processor, that a geographically diverse data storage system has scaled-out from a first count of storage zones to a second count of storage zones by adding at least one additional storage zone;
  determining, by the system, a first chunk comprised in a first data protection set, according to a first erasure coding scheme, and stored via a first storage zone of the first count of storage zones, wherein the first data protection set further comprises a first erasure coding code chunk according to the first erasure coding scheme;
  initiating, by the system, transferring the first chunk to a second storage zone of the at least one additional storage zone;
  determining, by the system, a probability of a data loss event occurring based on a predicted result of combining the first erasure coding code chunk and a second erasure coding code chunk; and
  causing, by the system based on the probability of the data loss event, combining the first erasure coding code chunk and the second erasure coding code chunk, resulting in a third erasure coding code chunk that is comprised in a second data protection set that protects the first chunk, wherein the first erasure coding chunk corresponds to a first coding matrix, wherein the second erasure coding code chunk corresponds to a second coding matrix, wherein the third erasure coding code chunk corresponds to a third coding matrix, and wherein the first coding matrix is complementary to the second coding matrix.

16. The method of claim 15, wherein the causing the combining results in the second data protection set employing a second erasure coding scheme that is a different erasure coding scheme than the first erasure coding scheme, and wherein the second erasure coding scheme is associated with a lower storage overhead than the first erasure coding scheme.

17. The method of claim 15, wherein the determining that a geographically diverse data storage system has scaled-out comprises determining that the first count of storage zones is at least k+m, that the second count of storage zones is at least 2k+m, wherein k is a first count of data chunks stored in the first data protection set according to the first erasure coding scheme, and wherein m is a second count of erasure coding code chunks stored in the first data protection set according to the first erasure coding scheme.

18. A non-transitory machine-readable storage medium, comprising executable instructions that, when executed by a processor, facilitate performance of operations, comprising:
  determining that a geographically diverse data storage system has undergone a scaling-out event adding one or more additional storage zones, resulting in the geographically diverse data storage system changing from a first count of storage zones to a second count of storage zones;
  causing transferring of a first chunk from a first storage zone of the first count of storage zones to a second storage zone of the one or more additional storage zones, wherein a first data protection set employs a first erasure coding scheme, wherein the first data protection set comprises the first chunk, and wherein the first data protection set comprises a first erasure coding code chunk according to the first erasure coding scheme; and
  initiating, based on a probability of a data loss event occurring based on a predicted result of combining the first erasure coding code chunk and a second erasure coding code chunk, merging of the first erasure coding code chunk and the second erasure coding code chunk, resulting in a third erasure coding code chunk that is comprised in a second data protection set that protects the first chunk, wherein the first erasure coding chunk corresponds to a first coding matrix, wherein the second erasure coding code chunk corresponds to a second coding matrix, and wherein the first coding matrix is complementary to the second coding matrix.

19. The non-transitory machine-readable storage medium of claim 18, wherein the wherein the second data protection set has a lower storage overhead than the first data protection set.

20. The non-transitory machine-readable storage medium of claim 19, wherein the first count of storage zones is at least k+m, wherein the second count of storage zones is at least 2k+m, wherein k is a first count of data chunks stored in the first data protection set according to the first erasure coding scheme, and wherein m is a second count of erasure coding code chunks stored in the first data protection set according to the first erasure coding scheme.

* * * * *